(12) United States Patent
Xie et al.

(10) Patent No.: US 9,318,342 B2
(45) Date of Patent: Apr. 19, 2016

(54) METHODS OF REMOVING FINS FOR FINFET SEMICONDUCTOR DEVICES

(71) Applicant: GLOBALFOUNDRIES Inc., Grand Cayman (KY)

(72) Inventors: Ruilong Xie, Niskayuna, NY (US); Andreas Knorr, Wappingers Falls, NY (US); Ajey Poovannummoottil Jacob, Watervliet, NY (US); Michael Hargrove, Clinton Corners, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/811,987

(22) Filed: Jul. 29, 2015

(65) Prior Publication Data

US 2015/0340238 A1 Nov. 26, 2015

Related U.S. Application Data

(62) Division of application No. 14/195,344, filed on Mar. 3, 2014, now Pat. No. 9,147,730.

(51) Int. Cl.
*H01L 21/311* (2006.01)
*H01L 21/308* (2006.01)
*H01L 29/06* (2006.01)
*H01L 21/8234* (2006.01)
*H01L 29/78* (2006.01)

(52) U.S. Cl.
CPC ........ *H01L 21/3085* (2013.01); *H01L 21/3081* (2013.01); *H01L 21/3086* (2013.01); *H01L 21/823431* (2013.01); *H01L 29/0649* (2013.01); *H01L 29/0692* (2013.01); *H01L 29/785* (2013.01)

(58) Field of Classification Search
CPC .................................................... H01L 21/3085
USPC .......................................................... 438/702
See application file for complete search history.

(56) References Cited

U.S. PATENT DOCUMENTS

2014/0374834 A1 12/2014 Luo et al.

*Primary Examiner* — Anthony Ho
(74) *Attorney, Agent, or Firm* — Amerson Law Firm, PLLC

(57) ABSTRACT

One illustrative method disclosed herein includes forming a plurality of initial fins in a substrate, wherein at least one of the initial fins is a to-be-removed fin, forming a material adjacent the initial fins, forming a fin removal masking layer above the plurality of initial fins, removing a desired portion of the at least one to-be-removed fin by: (a) performing a recess etching process on the material to remove a portion, but not all, of the material positioned adjacent the sidewalls of the at least one to-be-removed fin, (b) after performing the recess etching process, performing a fin recess etching process to remove a portion, but not all, of the at least one to be removed fin and (c) repeating steps (a) and (b) until the desired amount of the at least one to-be-removed fin is removed.

12 Claims, 20 Drawing Sheets

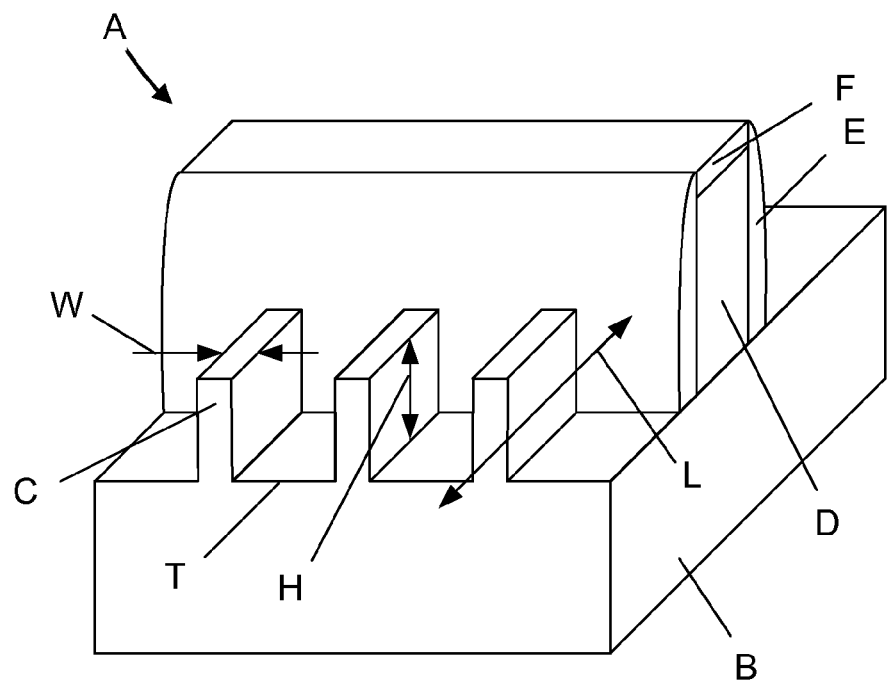
Figure 1A (Prior Art)
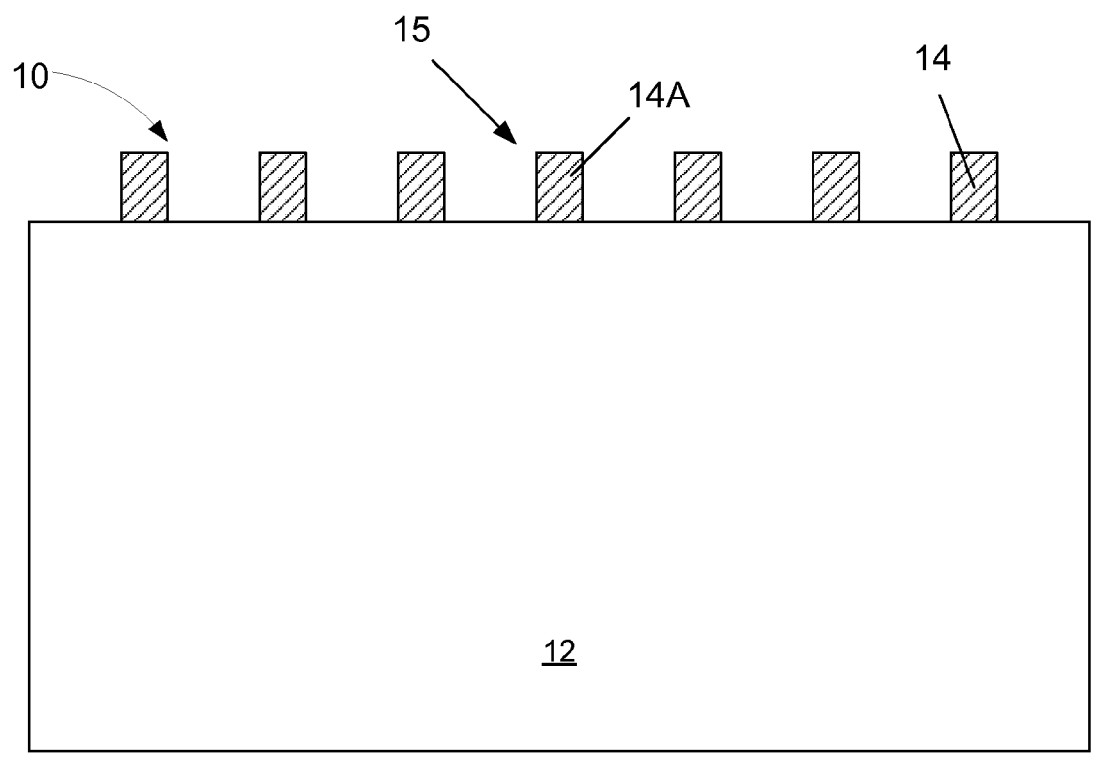
(Prior Art) Figure 1B

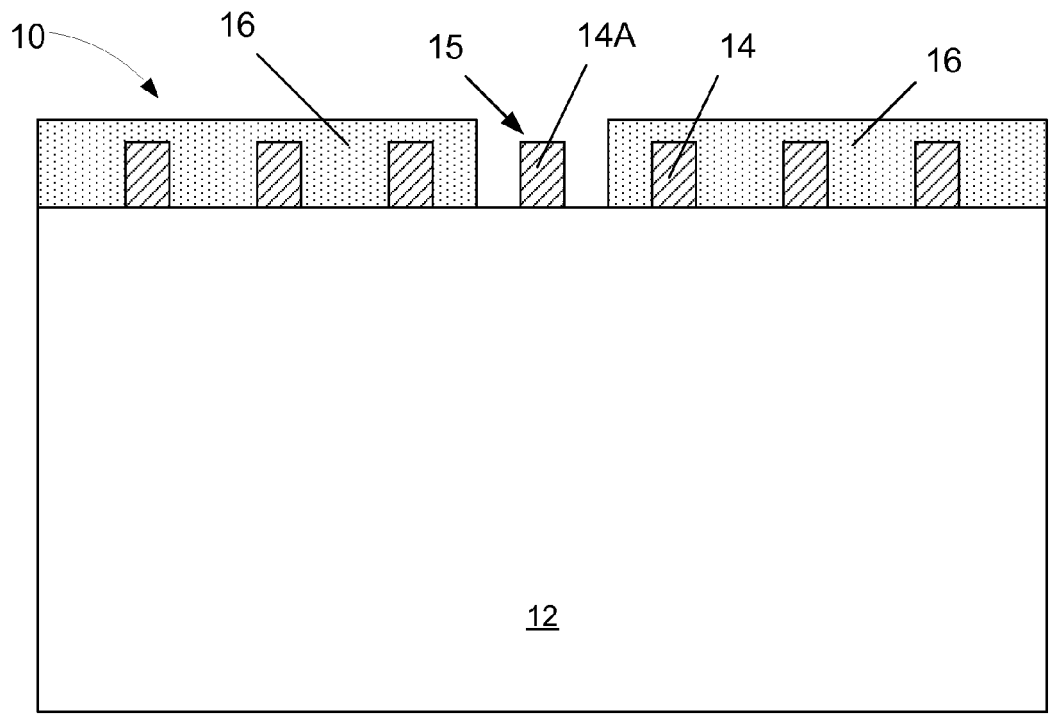
(Prior Art) Figure 1C
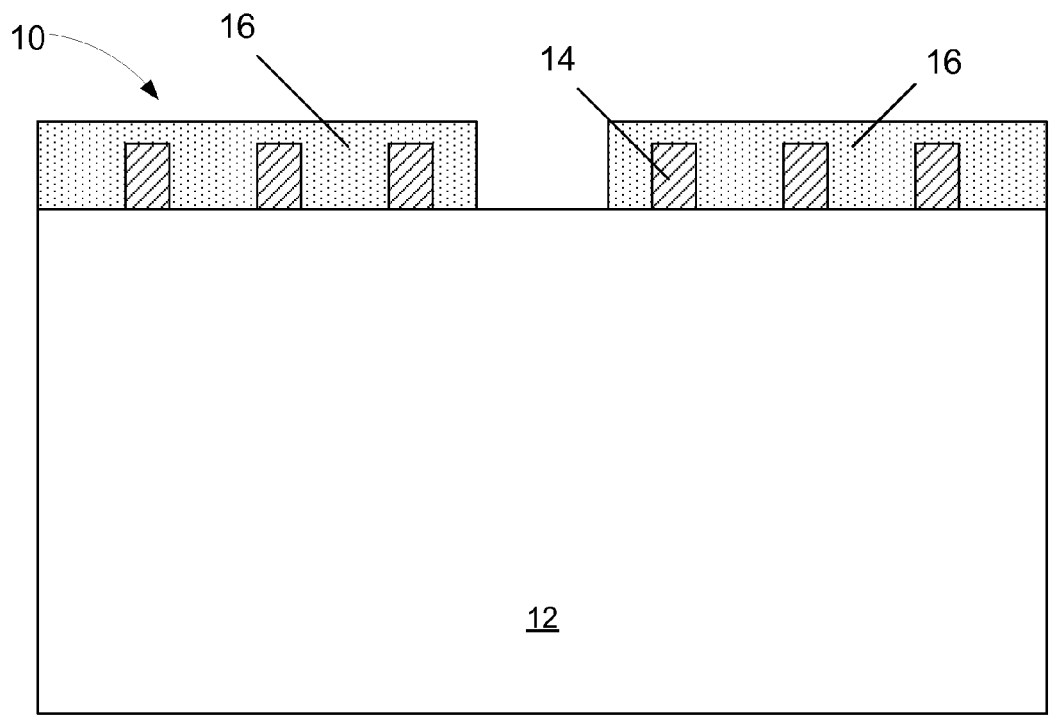
(Prior Art) Figure 1D

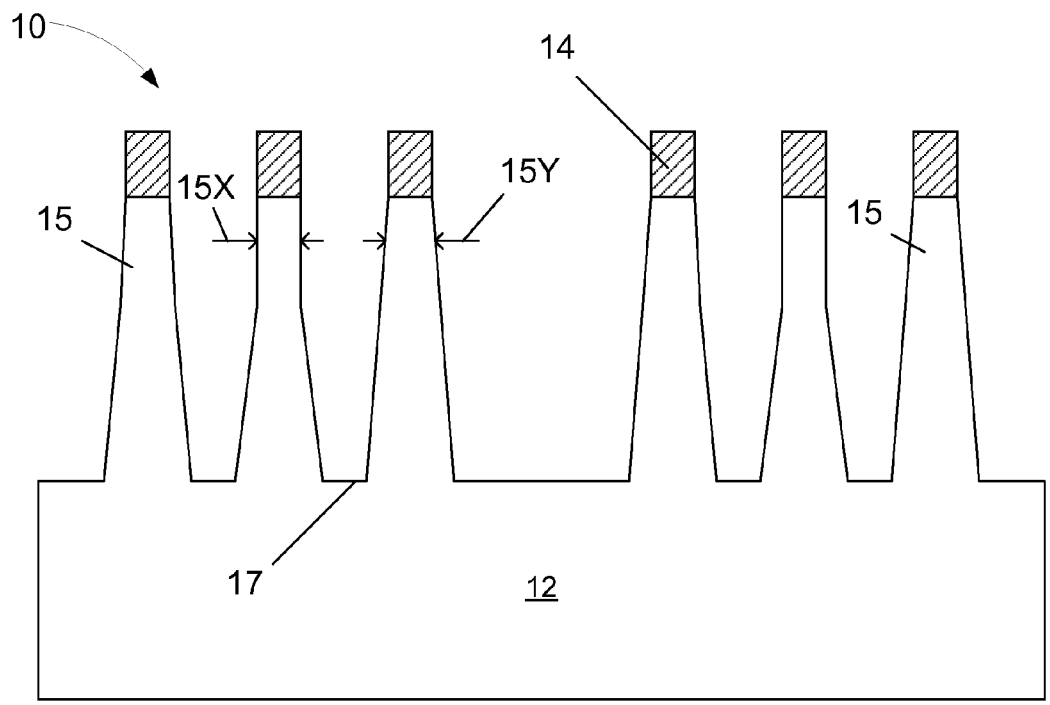
(Prior Art) Figure 1E
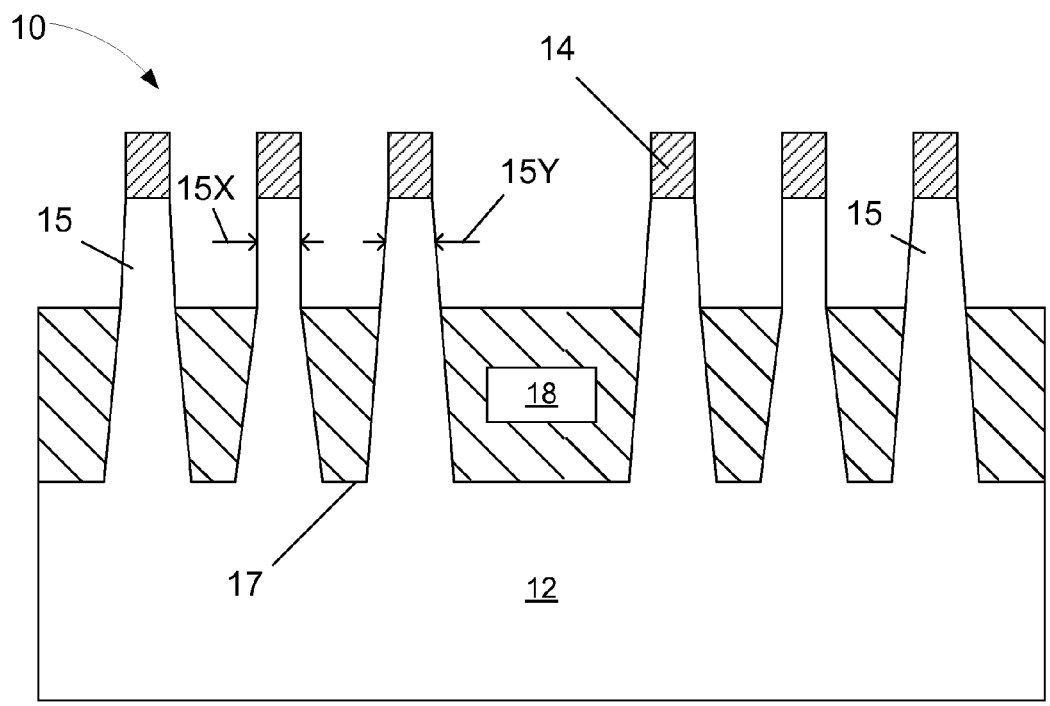
(Prior Art) Figure 1F

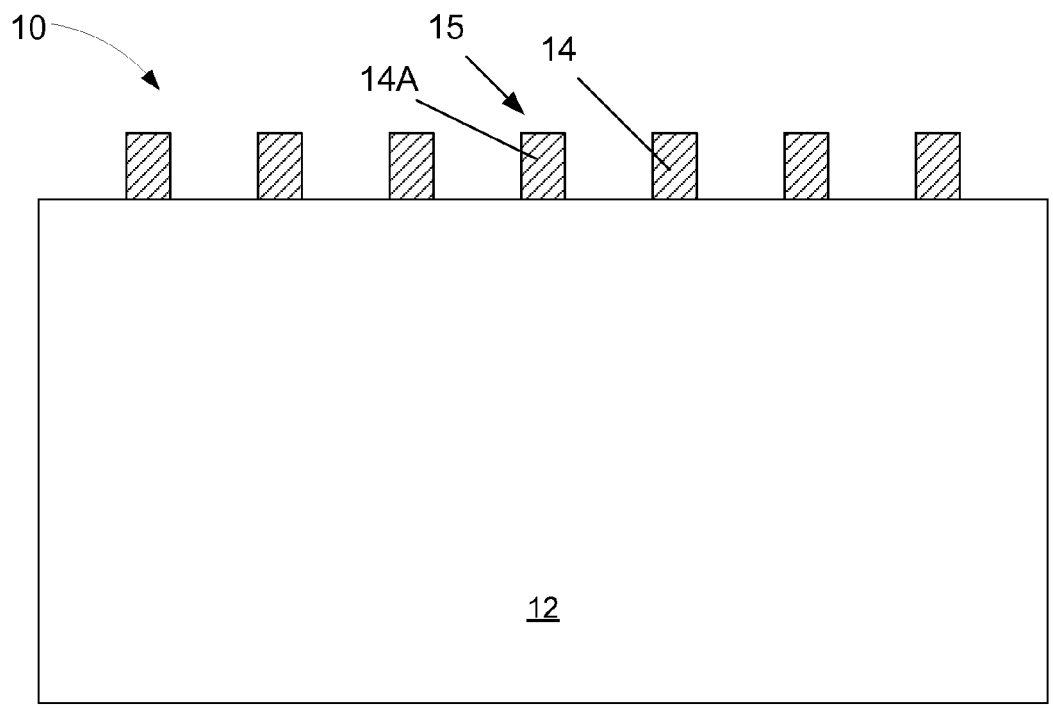
(Prior Art) Figure 1G
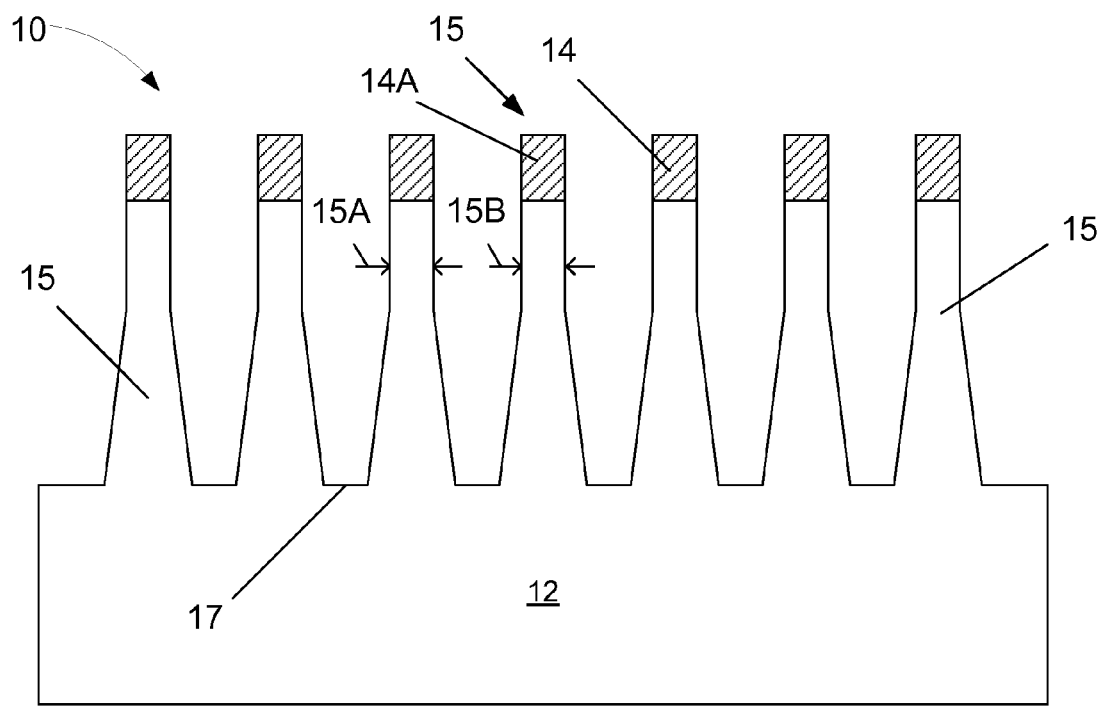
(Prior Art) Figure 1H

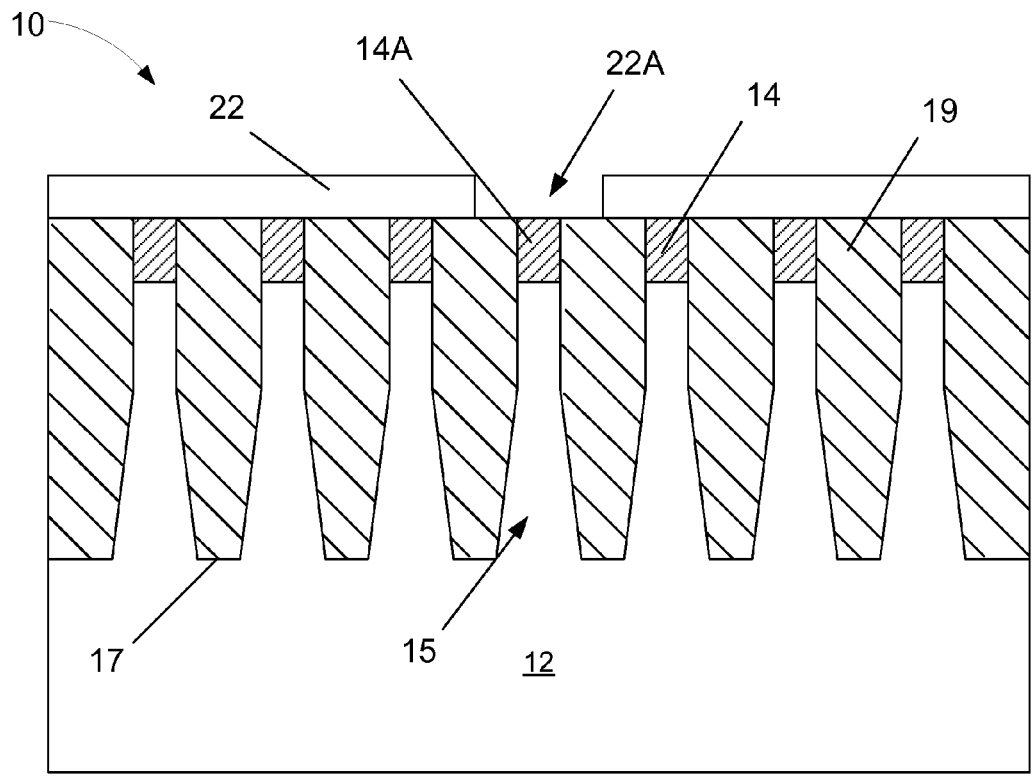
(Prior Art) Figure 1I
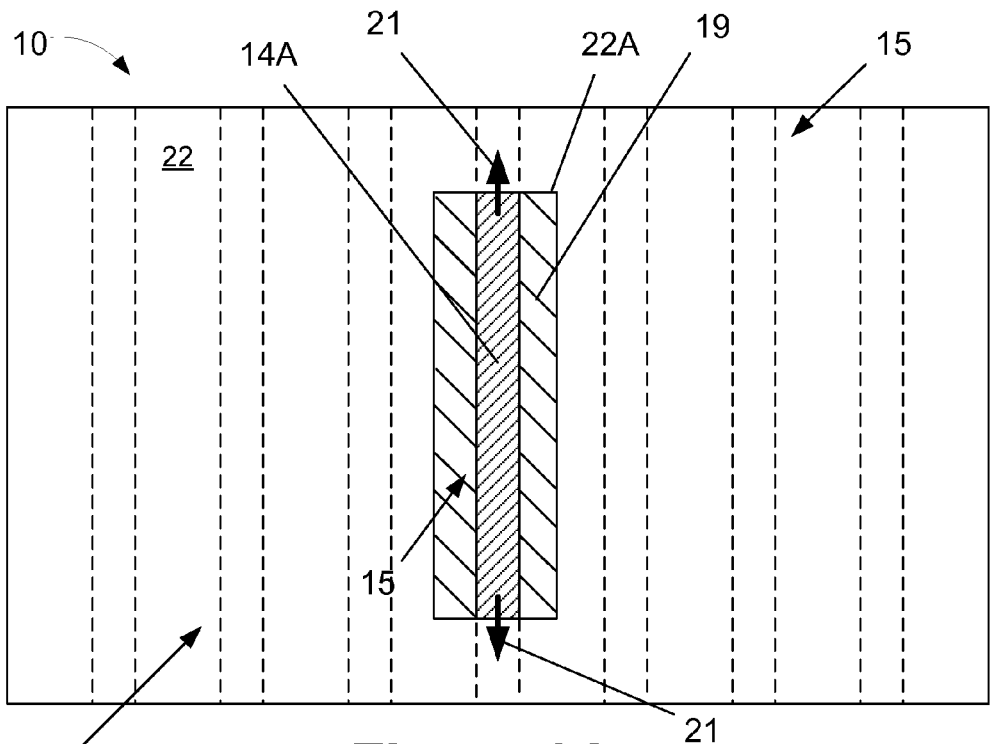
(Prior Art) Figure 1J

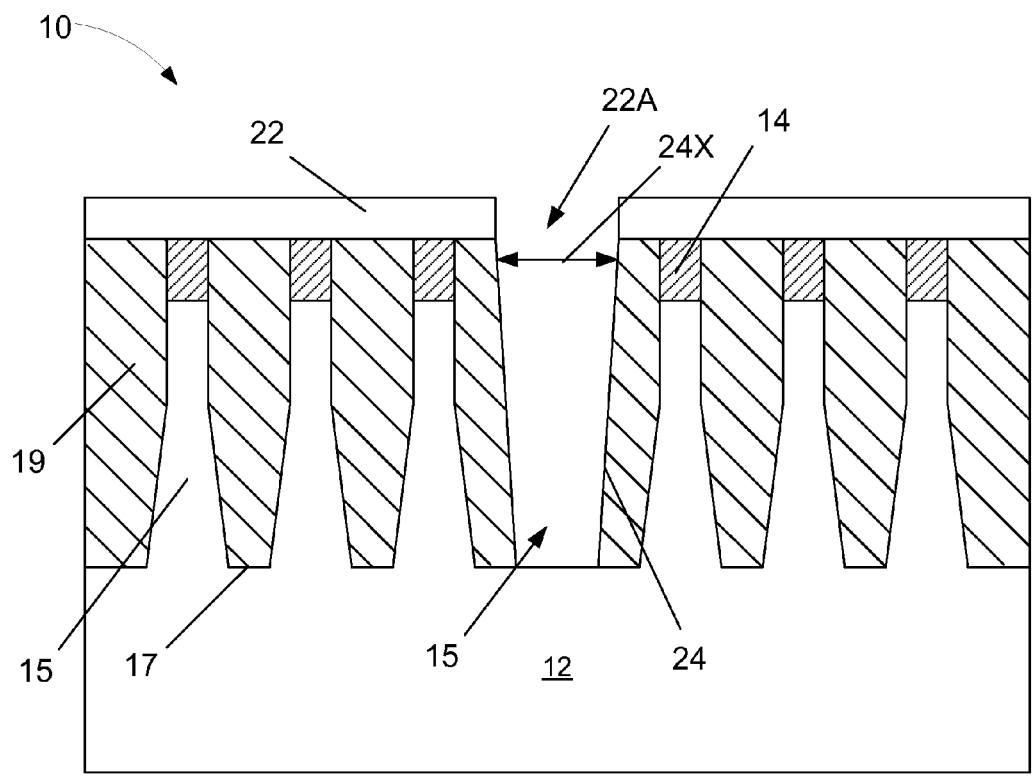
(Prior Art) Figure 1K
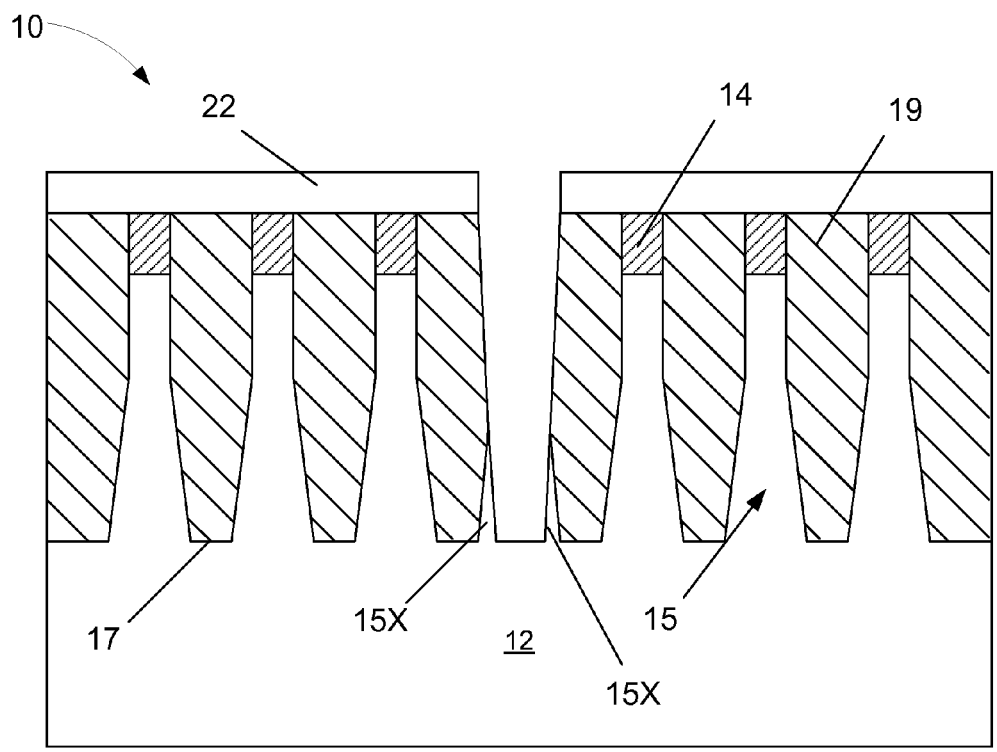
(Prior Art) Figure 1L

METHODS OF REMOVING FINS FOR FINFET SEMICONDUCTOR DEVICES

CROSS-REFERENCE TO RELATED APPLICATION

This is a divisional of co-pending application Ser. No. 14/195,344, filed Mar. 3, 2014.

BACKGROUND OF THE INVENTION

1. Field of the Invention

Generally, the present disclosure relates to the manufacturing of semiconductor devices, and, more specifically, to various methods of forming fins for FinFET semiconductor devices and selectively removing some of the fins by performing a cyclical fin cutting process.

2. Description of the Related Art

In modern integrated circuits, such as microprocessors, storage devices and the like, a very large number of circuit elements, especially transistors, are provided and operated on a restricted chip area. Immense progress has been made over recent decades with respect to increased performance and reduced feature sizes of circuit elements, such as transistors. However, the ongoing demand for enhanced functionality of electronic devices forces semiconductor manufacturers to steadily reduce the dimensions of the circuit elements and to increase the operating speed of the circuit elements. The continuing scaling of feature sizes, however, involves great efforts in redesigning process techniques and developing new process strategies and tools so as to comply with new design rules. Generally, in complex circuitry including complex logic portions, MOS technology is presently a preferred manufacturing technique in view of device performance and/or power consumption and/or cost efficiency. In integrated circuits including logic portions fabricated by MOS technology, field effect transistors (FETs) are provided that are typically operated in a switched mode, that is, these devices exhibit a highly conductive state (on-state) and a high impedance state (off-state). The state of the field effect transistor is controlled by a gate electrode, which controls, upon application of an appropriate control voltage, the conductivity of a channel region formed between a drain region and a source region.

To improve the operating speed of FETs, and to increase the density of FETs on an integrated circuit device, device designers have greatly reduced the physical size of FETs over the years. More specifically, the channel length of FETs has been significantly decreased, which has resulted in improving the switching speed of FETs. However, decreasing the channel length of a FET also decreases the distance between the source region and the drain region. In some cases, this decrease in the separation between the source and the drain makes it difficult to efficiently inhibit the electrical potential of the source region and the channel from being adversely affected by the electrical potential of the drain. This is sometimes referred to as a so-called short channel effect, wherein the characteristic of the FET as an active switch is degraded.

In contrast to a FET, which has a planar structure, a so-called FinFET device has a three-dimensional (3D) structure. FIG. 1A is a perspective view of an illustrative prior art FinFET semiconductor device "A" that is formed above a semiconductor substrate B that will be referenced so as to explain, at a very high level, some basic features of a FinFET device. In this example, the FinFET device A includes three illustrative fins C, a gate structure D, sidewall spacers E and a gate cap layer F. Trenches T are formed in the substrate B to define the fins C. The gate structure D is typically comprised of a layer of gate insulating material (not separately shown), e.g., a layer of high-k insulating material (k-value of 10 or greater) or silicon dioxide, and one or more conductive material layers (e.g., metal and/or polysilicon) that serve as the gate electrode for the device A. The fins C have a three-dimensional configuration: a height H, a width W and an axial length L. The axial length L corresponds to the direction of current travel in the device A when it is operational. The portions of the fins C covered by the gate structure D are the channel regions of the FinFET device A. In a conventional process flow, the portions of the fins C that are positioned outside of the spacers E, i.e., in the source/drain regions of the device A, may be increased in size or even merged together (a situation not shown in FIG. 1A) by performing one or more epitaxial growth processes. The process of increasing the size of or merging the fins C in the source/drain regions of the device A is performed to reduce the resistance of source/drain regions and/or make it easier to establish electrical contact to the source/drain regions. Even if an epi "merger" process is not performed, an epi growth process will typically be performed on the fins C to increase their physical size.

In the FinFET device, the gate structure D may enclose both the sides and the upper surface of all or a portion of the fins C to form a tri-gate structure so as to use a channel having a three-dimensional structure instead of a planar structure. In some cases, an insulating cap layer (not shown), e.g., silicon nitride, is positioned at the top of the fins C and the FinFET device only has a dual-gate structure (sidewalls only). Unlike a planar FET, in a FinFET device, a channel is formed perpendicular to a surface of the semiconducting substrate so as to reduce the physical size of the semiconductor device. Also, in a FinFET, the junction capacitance at the drain region of the device is greatly reduced, which tends to significantly reduce short channel effects. When an appropriate voltage is applied to the gate electrode of a FinFET device, the surfaces (and the inner portion near the surface) of the fins C, i.e., the vertically oriented sidewalls and the top upper surface of the fin, form a surface inversion layer or a volume inversion layer that contributes to current conduction. In a FinFET device, the "channel-width" is estimated to be about two times (2x) the vertical fin-height plus the width of the top surface of the fin, i.e., the fin width. Multiple fins can be formed in the same foot-print as that of a planar transistor device. Accordingly, for a given plot space (or foot-print), FinFETs tend to be able to generate significantly higher drive current density than planar transistor devices. Additionally, the leakage current of FinFET devices after the device is turned "OFF" is significantly reduced as compared to the leakage current of planar FETs, due to the superior gate electrostatic control of the "fin" channel on FinFET devices. In short, the 3D structure of a FinFET device is a superior MOSFET structure as compared to that of a planar FET, especially in the 20 nm CMOS technology node and beyond. The gate structures D for such FinFET devices may be manufactured using so-called "gate-first" or "replacement gate" (gate-last) manufacturing techniques.

Both FET and FinFET semiconductor devices have an isolation structure, e.g., a shallow trench isolation structure that is formed in the semiconducting substrate around the device so as to electrically isolate the semiconductor device. Traditionally, isolation structures were always the first structure that was formed when manufacturing semiconductor devices. The isolation structures were formed by etching the trenches for the isolation structures and thereafter filling the trenches with the desired insulating material, e.g., silicon dioxide. After the isolation structures were formed, various process operations were performed to manufacture the semiconductor device. In the case of a FinFET device, this involved masking the previously formed isolation structure and etching the trenches in the substrate that defined the fins. As FinFET devices have been scaled to meet ever increasing performance and size requirements, the width W of the fins C has become very small, e.g., 6-12 nm, and the fin pitch has also been significantly decreased, e.g., the fin pitch may be on the order of about 30-60 nm.

However, as the dimensions of the fins became smaller, problems arose with manufacturing the isolation structures before the fins were formed. As one example, trying to accurately define very small fins in regions that were separated by relatively large isolation regions was difficult due to the non-uniform spacing between various structures on the substrate. One manufacturing technique that is employed in manufacturing FinFET devices is to initially form the trenches T in the substrate B to define multiple "fins" that extend across the substrate, and thereafter remove some of the fins C where larger isolation structures will be formed. Using this type of manufacturing approach, better accuracy and repeatability may be achieved in forming the fins C to very small dimensions due to the more uniform environment in which the etching process that forms the trenches T is performed.

After the trenches T have been formed, some of the fins C must be removed to create room for or define the spaces where isolation regions will ultimately be formed. There are two commonly employed techniques for accomplishing the goal of removing the desired number of fins C. One such removal process is typically referred to as "Fins-cut-First," as will be described with reference to FIGS. 1B-1F. Accordingly, FIG. 1B depicts the device after a patterned hard mask layer 14, e.g., a patterned layer of silicon nitride, was formed above the substrate 12 in accordance with the desired fin pattern and pitch. In the depicted example, only a single fin will be removed, i.e., the fin 15 corresponding to the feature 14A, to make room for the isolation region. However, as will be recognized by those skilled in the art, depending upon the desired final size of the isolation region, more than one fin may be removed.

FIG. 1C depicts the device 10 after a patterned masking layer 16, e.g., a patterned layer of photoresist, has been formed above the patterned hard mask layer 14. The patterned masking layer 16 has an opening that exposes the feature 14A for removal.

FIG. 1D depicts the device 10 after an etching process has been performed through the patterned masking layer 16 so as to remove the exposed feature 14A of the patterned hard mask layer 14.

FIG. 1E depicts the device 10 after the patterned masking layer 16 was removed and after an anisotropic etching process was performed through the patterned hard mask layer 14 (without the feature 14A) so as to define full-depth trenches 17 in the substrate 12 that define the fins 15. Due to the removal of the feature 14A, this etching process removes the portions of the substrate 12 that would have otherwise formed a fin 15 in the area under the feature 14A. One problem with the "fin-cut-first" approach is that it inevitably causes different fin sizes, i.e., the dimensions 15X and 15Y are different. This is especially true between fins 15 inside an array of fins and the fins at the edge of the active region that is close to the isolation region. This occurs due to etch loading effects wherein there are different etch rates and etch profiles due to differing patterning densities, pitch, etc.

FIG. 1F depicts the device 10 after several process operations were performed. First, a layer of insulating material 18, such as silicon dioxide, was formed so as to overfill the trenches 17. A chemical mechanical polishing (CMP) process was then performed to planarize the upper surface of the insulating material 18 with the top of the patterned hard mask 14. Thereafter, an etch-back process was performed to recess the layer of insulating material 18 between the fins 15 and thereby expose the upper portions of the fins 15, which corresponds to the final fin height of the fins 15. At this point in the process, the patterned hard mask 14 may or may not be thereafter removed. Next, the gate structure of the device 10 may be formed using either gate-first or gate-last manufacturing techniques.

Another fin removal process is typically referred to as "Fins-cut-Last," as will be described with reference to FIGS. 1G-1L. FIG. 1G depicts the device 10 after the patterned hard mask layer 14 was formed above the substrate 12 in accordance with the desired fin pattern and pitch. As before, in the depicted example, only a single fin will be removed, i.e., the fin 15 corresponding to the feature 14A, to make room for the isolation region. However, as will be recognized by those skilled in the art, depending upon the desired final size of the isolation region, more than one fin may be removed.

FIG. 1H depicts the device 10 after an anisotropic etching process was performed through the patterned hard mask layer 14 so as to define full-depth trenches 17 in the substrate 12 that define the fins 15. Note that, in the Fins-cut-Last approach, the size of the fins is very uniform up near the top of the initial fins 15, i.e., the dimension 15A is approximately equal to the dimension 15B. This is primarily due to the fact that, in this approach, fins 15 are formed everywhere on the wafer and there is no undesirable etch loading effects.

FIGS. 1I-1K depict the device 10 after several process operations were performed. First, a layer of insulating material 19, such as silicon dioxide, was formed so as to overfill the trenches 17. Then a CMP process was performed to planarize the upper surface of the layer of insulating material 19 with the patterned hard mask layer 14. Next, a patterned masking layer 22, e.g., a patterned layer of photoresist, was formed above the layer of insulating material 19. The patterned hard mask layer 22 has an opening 22A positioned above the portion of the underlying fin that is to be removed. FIG. 1J is a plan view of the patterned masking layer 22 with a generally rectangular-shaped opening 22A positioned above the portion of the underlying fin that is to be removed.

FIG. 1K depicts the device 10 after one or more anisotropic etching processes were performed to remove the exposed portions of the layer of insulating material 19, the exposed portions of the hard mask layer 14, i.e., the feature 14A, and the underlying fin 15. This results in the formation of a trench 24 in the layer of insulating material 19. Typically, as shown in the plan view in FIG. 1J the trench 24 will take the form of a rectangle that corresponds approximately to the opening 22A in the patterned hard mask layer 22. Inevitably, there will be some inward tapering of the sidewalls of the trench 24. Although not depicted in the drawings, after the trench 24 is formed, the patterned masking layer 22 will be removed and additional oxide material (not shown) will be formed through the opening 22A in the trench 24 where the fin 15 was removed. Then a chemical mechanical polishing (CMP) process will be performed to planarize the upper surface of all of the insulating materials with the top of the patterned hard mask 14. Thereafter, the isolation regions between devices will be masked and an etch-back process will be performed to recess the layer of insulating material 19 between the fins 15 for each device and thereby expose the upper portions of the fins 15, which corresponds to the final fin height of the fins 15.

One problem with the fins-cut-last approach is that if the critical dimension (CD) 24X of the opening 22A of the trench 24 is relatively large, then there is less margin for misalignment error when removing the unwanted fin, i.e., there is less margin for error so as to avoid damaging the adjacent fins when the trench 24 is etched. With reference to FIG. 1L, if the CD 24X of the opening 22A is kept small, there will typically be some residual portion 15X of the fin 15 remaining at the bottom of the trench 24. If the size of the opening 22A is increased in an effort to insure complete removal of the unwanted residual fin materials 15X at the bottom of the trench 24, then there is a much greater likelihood of damaging the fins adjacent the trench 24 when it is etched. These issues only get worse as the depth of the trench 24 increases and as packing densities increase.

Some of the aforementioned problems could potentially be remedied by performing a selective isotropic etching process to limit or eliminate the residual fin material 15X relative to the surrounding insulating material 19. In one sense, removing the unwanted residual fin material 15X by performing such an isotropic etching process would be beneficial as compared to removing the fins by performing an anisotropic etching process because, due to the selective and isotropic nature of the process, there would be less chance of damaging adjacent fins (if the CD 24X is too large) and less chance of leaving the undesirable residual fin material 15X at or near the bottom of the trench 24 (if the CD 24X is too small). However, with referenced to FIG. 1J, performing such an isotropic etching process may cause unwanted loss of the remaining portions of the fin 15 positioned below the edges of the rectangular opening 22A (when viewed from above) in the patterned masking layer 22. That is, due to the nature of an isotropic etching process, there may be some undesirable loss of the fin material in the directions indicated by the arrows 21 in FIG. 1J.

The present disclosure is directed to various methods of forming fins for FinFET semiconductor devices and selectively removing some of the fins by performing a cyclical fin cutting process that may solve or reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming fins for FinFET semiconductor devices and selectively removing some of the fins by performing a cyclical fin cutting process. One illustrative method disclosed herein includes, among other things, forming a plurality of trenches in a semiconductor substrate to thereby define a plurality of initial fins in the substrate, the initial fins having sidewalls, wherein at least one of the initial fins is a to-be-removed fin, forming a material (e.g., liner layer or a layer of insulating material) adjacent at least the sidewalls of the initial fins and within the trenches, forming a fin removal masking layer above the plurality of initial fins, the fin removal masking layer having an opening positioned above the at least one to-be-removed fin and at least a portion of the material that was formed adjacent the at least one to-be-removed fin, removing a desired portion of the at least one to-be-removed fin by, (a) performing a recess etching process on the material that was formed adjacent the at least one to-be-removed fin to remove a portion, but not all, of the material that was formed adjacent the at least one to-be-removed fin, (b) after performing the recess etching process, performing a fin recess etching process to remove a portion, but not all, of the at least one to-be-removed fin, and (c) repeating steps (a) and (b) until the desired amount of the at least one to-be-removed fin is removed and forming an insulating material in an area that includes an area formerly occupied by the at least one to-be-removed fin.

In another embodiment, a method disclosed herein includes forming a plurality of trenches in a semiconductor substrate to thereby define a plurality of initial fins in the substrate, wherein at least one of the initial fins is a to-be-removed fin, forming a liner layer adjacent at least the sidewalls of the initial fins, forming a layer of insulating material adjacent the liner layer and within the trenches, forming a fin removal masking layer above the plurality of initial fins, the fin removal masking layer having an opening positioned above the at least one to-be-removed fin and the liner layer positioned adjacent the at least one to-be-removed fin, removing a desired portion of the at least one to-be-removed fin by: (a) performing a liner recess etching process on the liner layer to remove a portion, but not all, of the liner layer positioned adjacent the sidewalls of the at least one to-be-removed fin, (b) after performing the liner recess etching process, performing a fin recess etching process to remove a portion, but not all, of the at least one to be removed fin, and (c) repeating steps (a) and (b) until the desired amount of the at least one to-be-removed fin is removed and forming an insulating material in an area that includes an area formerly occupied by the at least one to-be-removed fin.

Another illustrative method includes, among other things, forming a trench patterning hard mask layer above a surface of a semiconductor substrate, performing at least one first etching process through the trench patterning hard mask layer to define a plurality of trenches in a semiconductor substrate to thereby define a plurality of initial fins in the substrate, wherein at least one of the initial fins is a to-be-removed fin, forming a layer of insulating material within the trenches, forming a patterned fin removal masking layer above the plurality of initial fins and the layer of insulating material, the patterned fin removal masking layer having an opening positioned above the at least one to-be-removed fin, wherein a portion of the trench patterning hard mask layer is positioned above the at least one to-be-removed fin and below the opening in the patterned fin removal masking layer, performing at least one second etching process through the opening in the patterned fin removal masking layer to remove at least the underlying portion of the trench patterning hard mask layer, after performing said at least one second etching process, performing a third etching process through the opening in the patterned fin removal masking layer to define a fin opening in the layer of insulating material that exposes substantially all of a vertical height of the at least one to-be-removed fin, performing a fourth etching process through the opening in the patterned fin removal masking layer and the fin opening in the layer of insulating material until the desired amount of the at least one to-be-removed fin is removed and forming an insulating material in an area that includes an area formerly occupied by the at least one to-be-removed fin.

BRIEF DESCRIPTION OF THE DRAWINGS

The disclosure may be understood by reference to the following description taken in conjunction with the accompanying drawings, in which like reference numerals identify like elements, and in which:

FIG. 1A is a perspective view of one illustrative embodiment of a prior art FinFET device;

FIGS. 1B-1L depict illustrative prior art methods of removing selected fin structures when forming FinFET semiconductor devices;

Figure 2A:
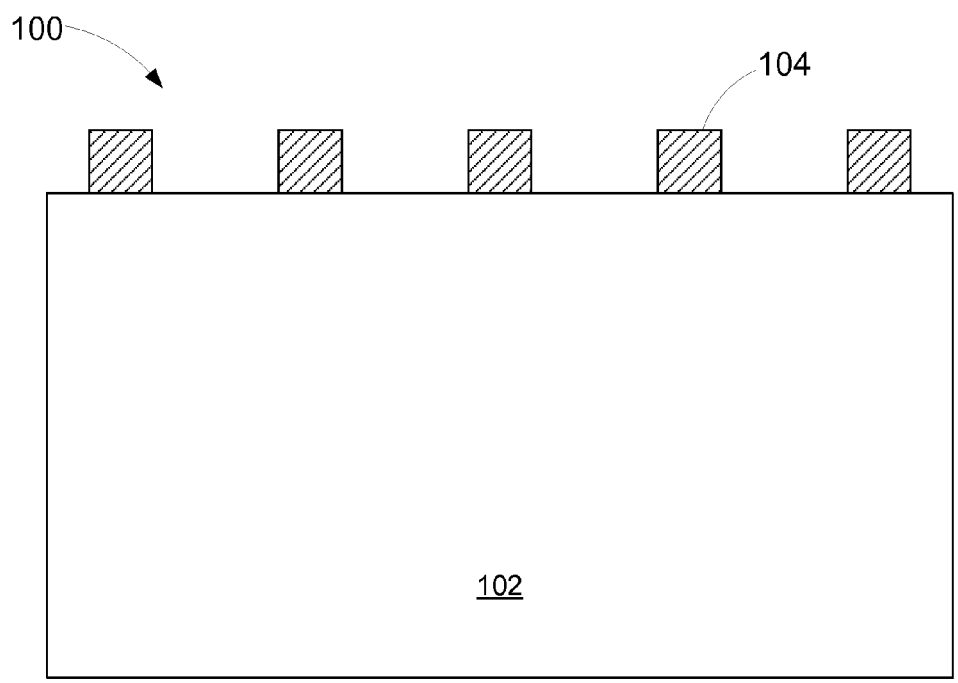
FIGS. 2A-2N depict various illustrative methods disclosed herein for forming fins for FinFET semiconductor devices and selectively removing some of the fins by performing a cyclical fin cutting process.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of forming fins for FinFET semiconductor devices and selectively removing some of the fins by performing a cyclical fin cutting process. As will be readily apparent to those skilled in the art upon a complete reading of the present application, the methods disclosed herein may be employed in manufacturing a variety of different devices, including, but not limited to, logic devices, memory devices, etc. With reference to the attached figures, various illustrative embodiments of the methods and devices disclosed herein will now be described in more detail.

Figure 2B:
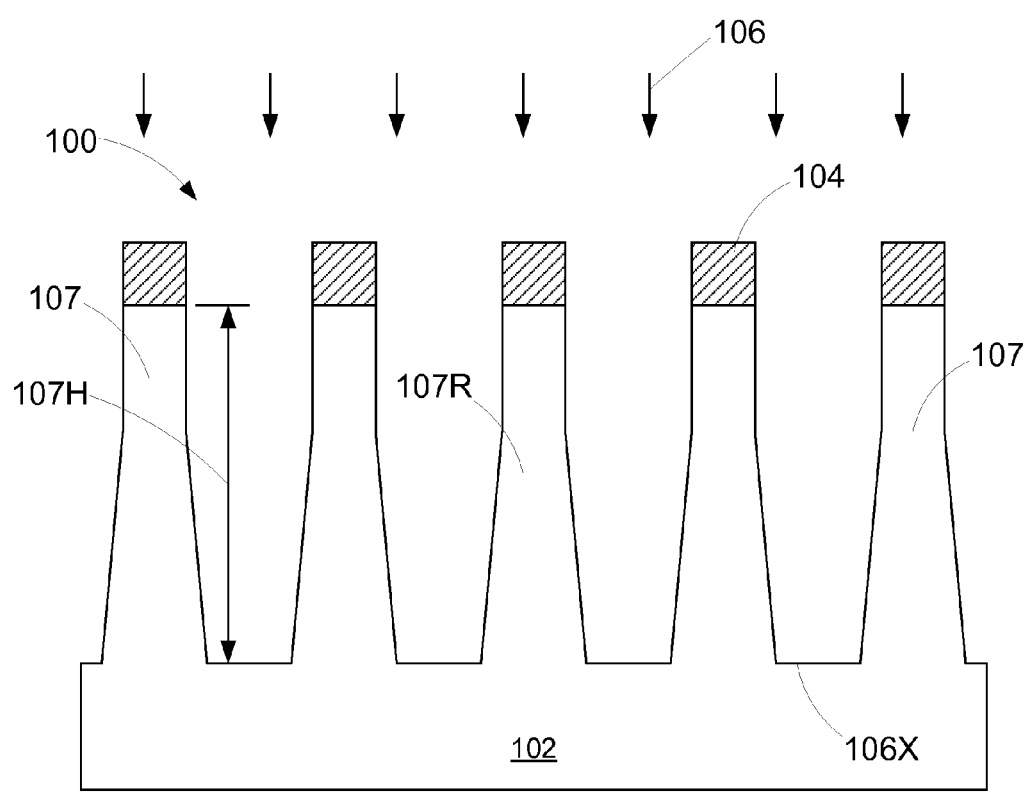
Figure 2C:
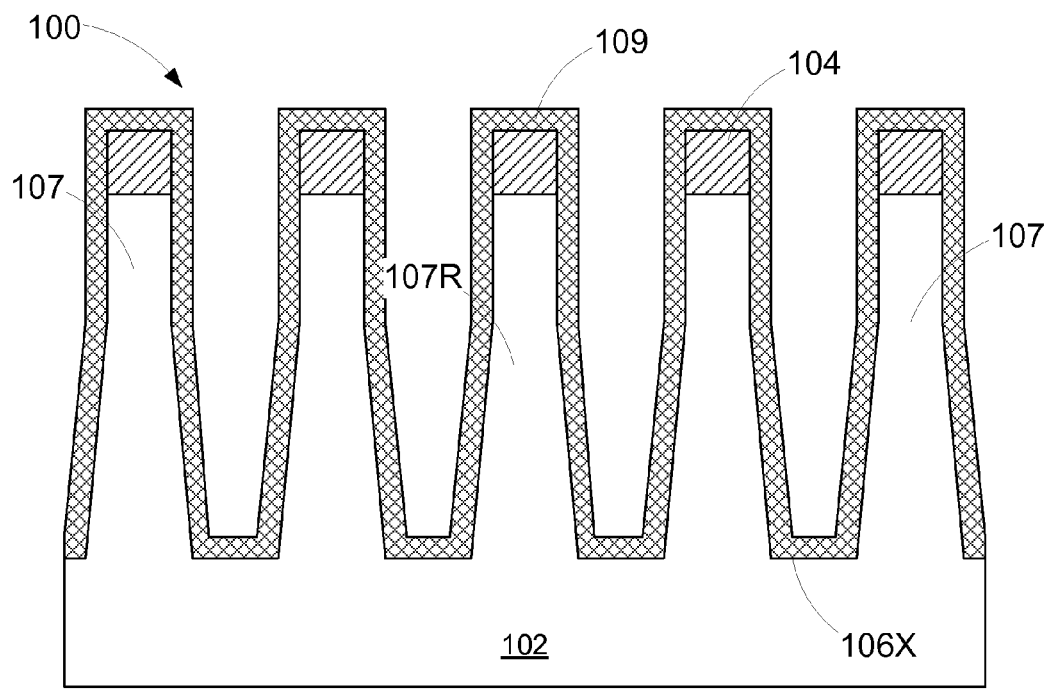
Figure 2D:
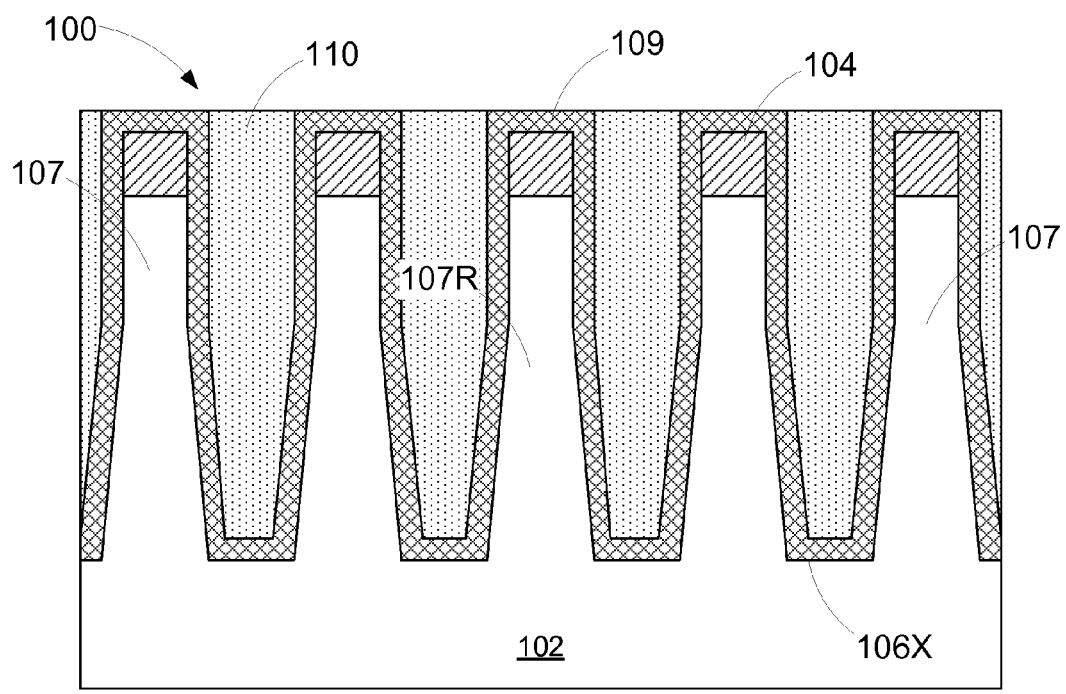
Figure 2E:
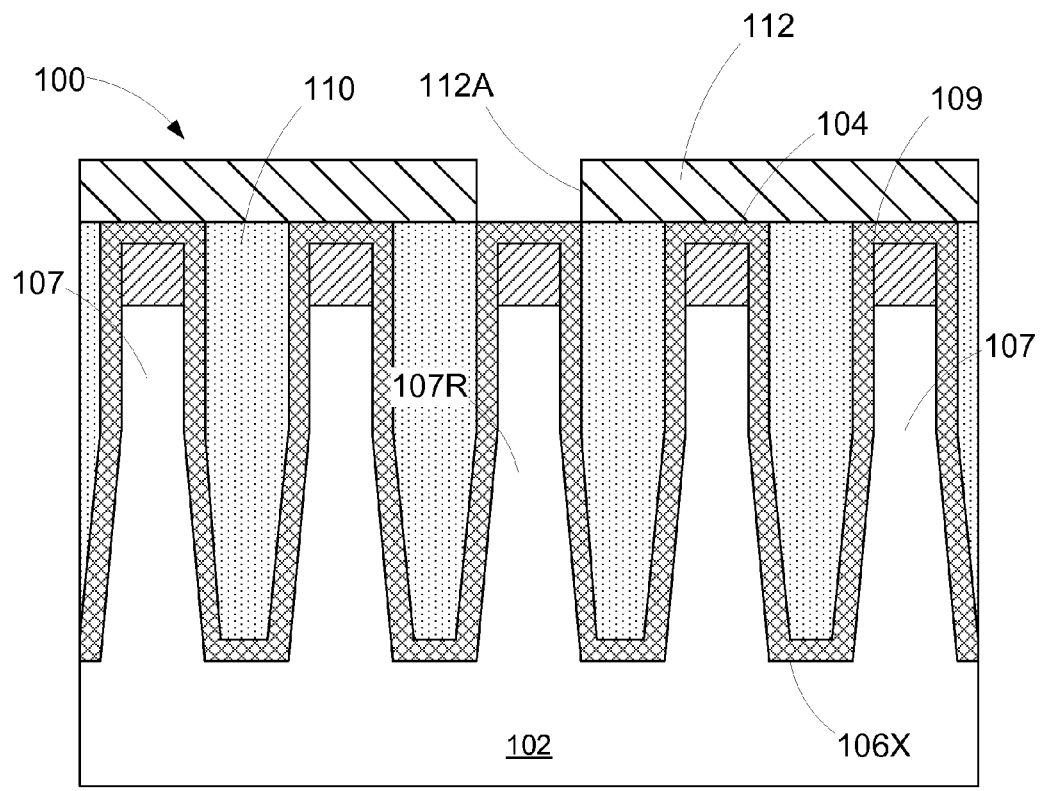
Figure 2F:
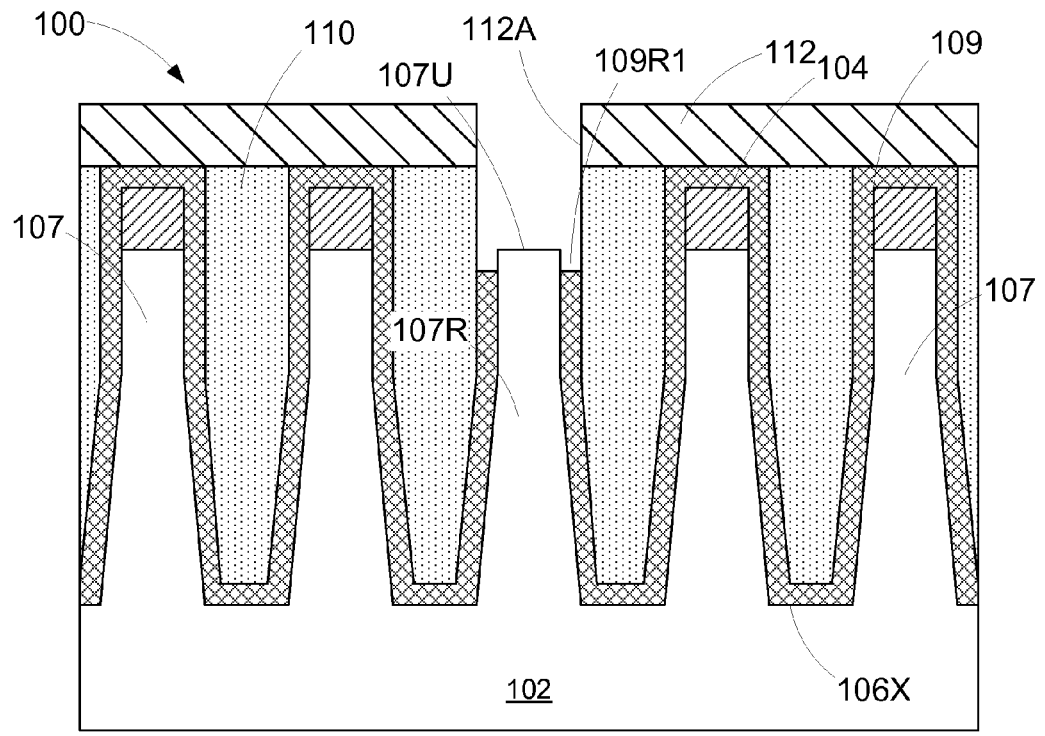
Figure 2G:
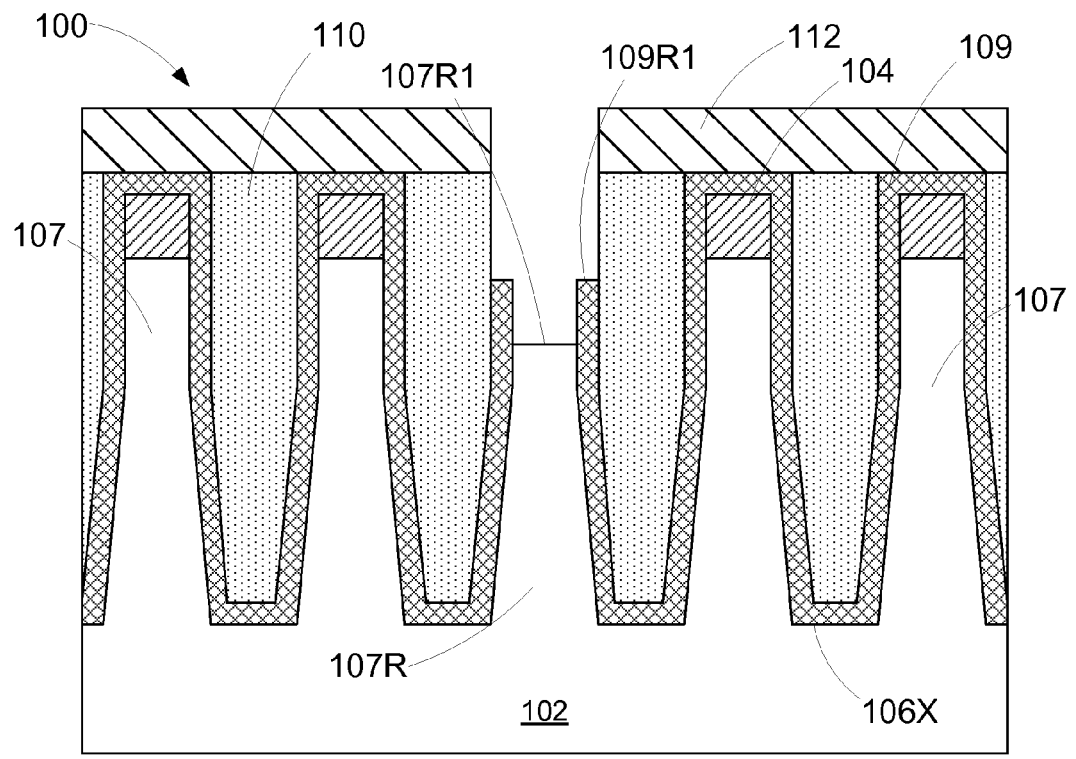
Figure 2H:
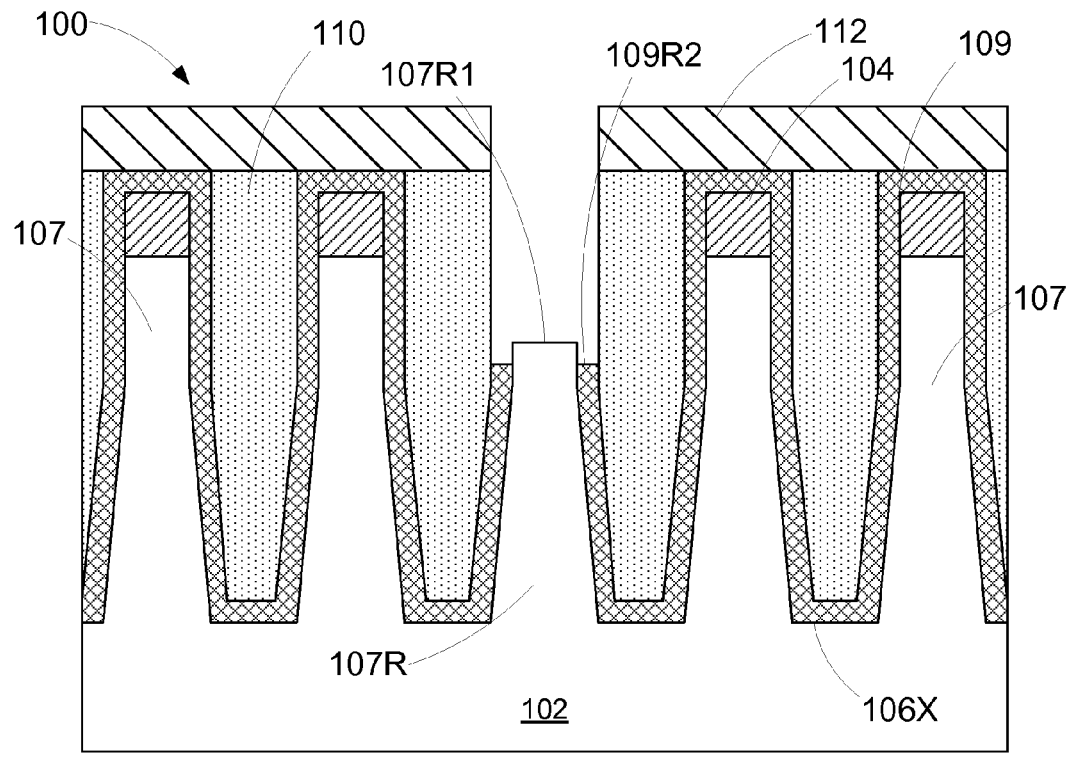
Figure 2I:
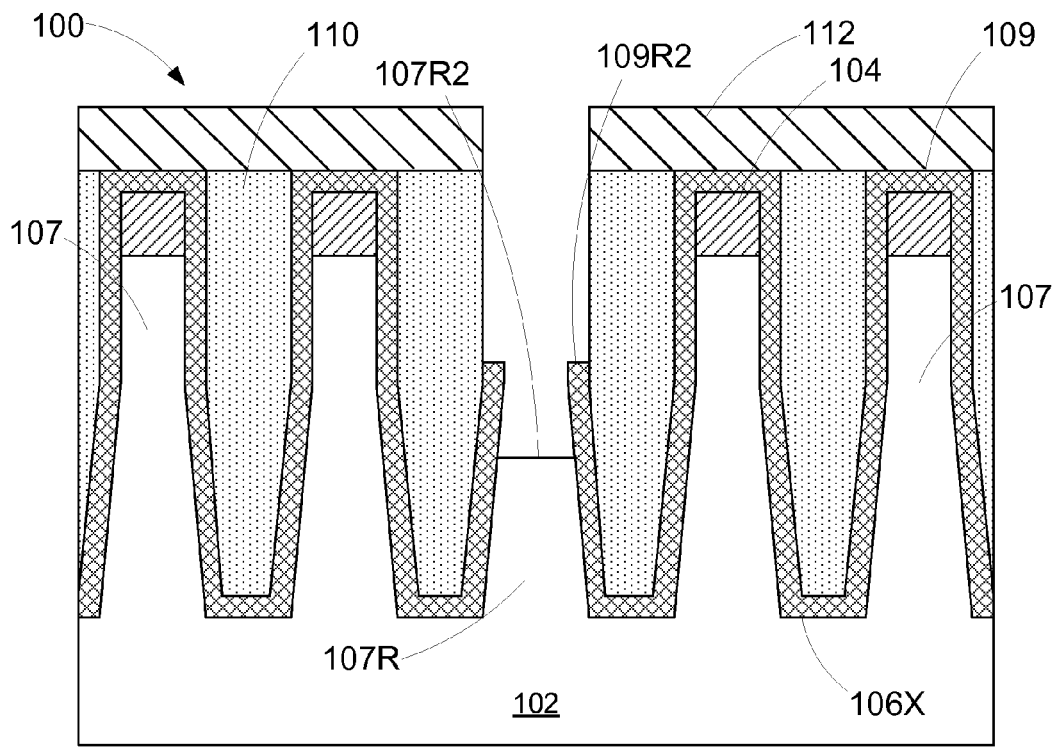
Figure 2J:
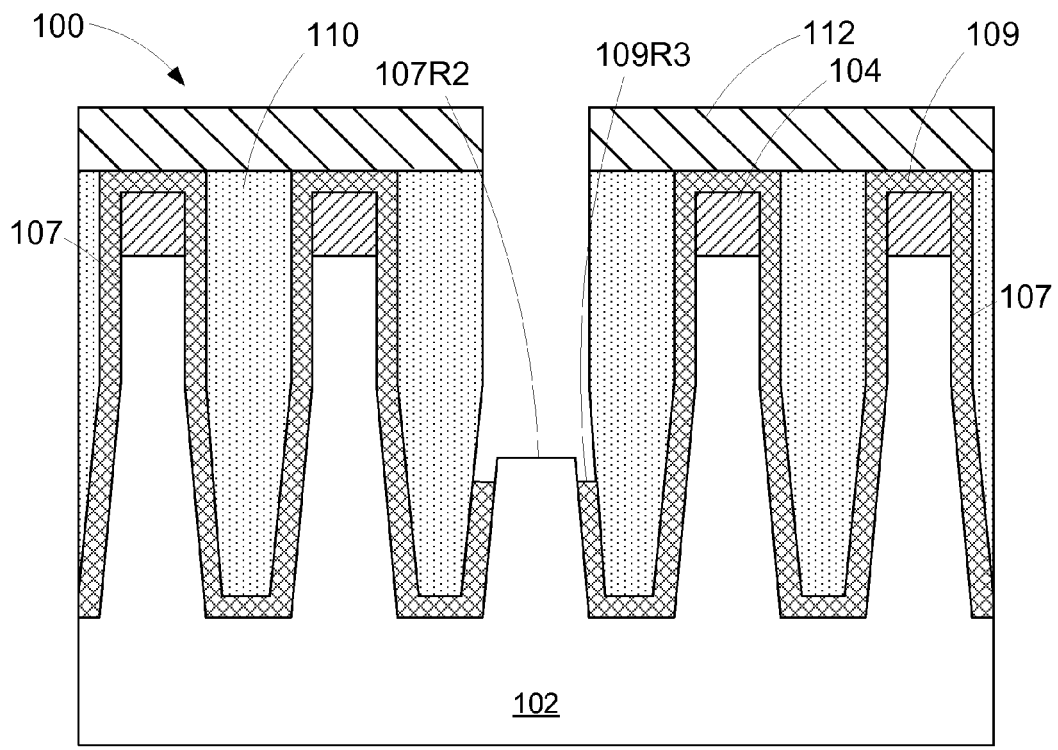
Figure 2K:
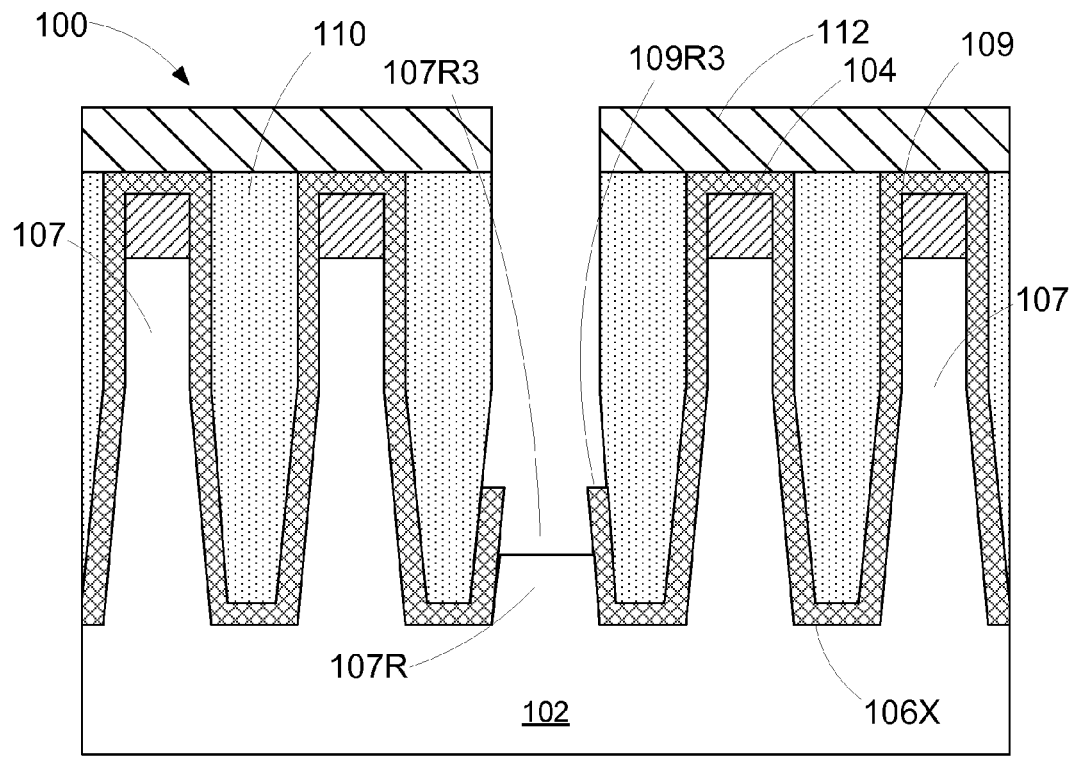
Figure 2L:
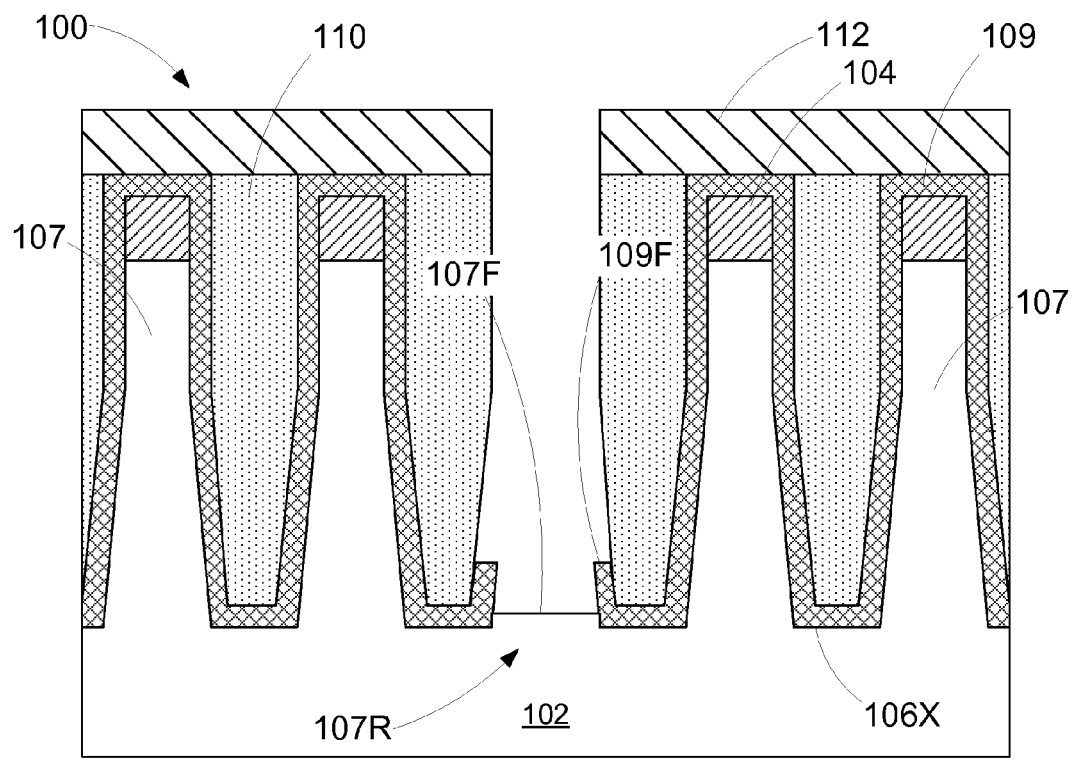
Figure 2M:
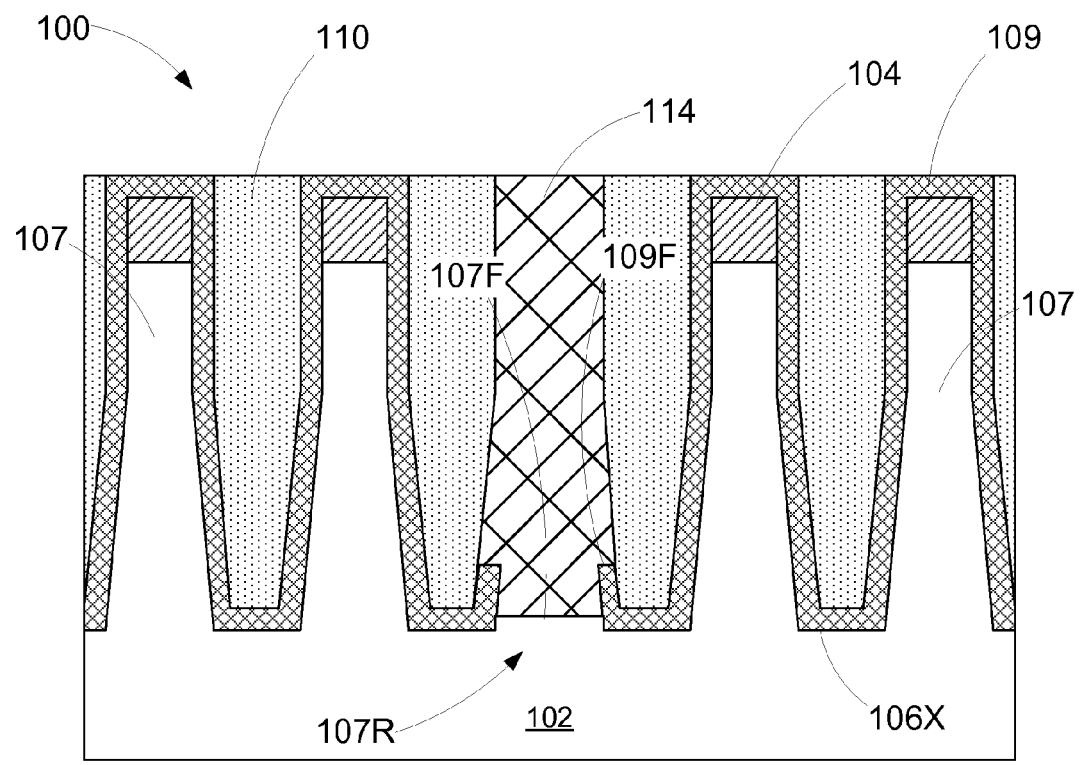
Figure 2N:
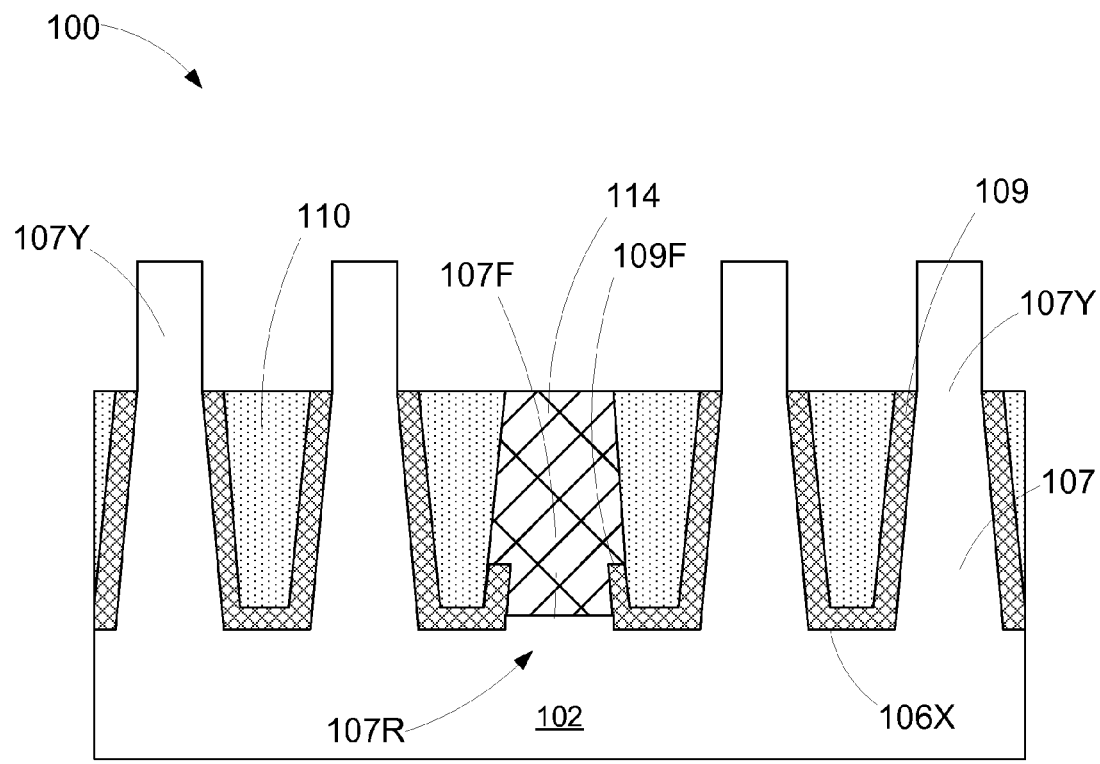

FIGS. 2A-2N depict one illustrative embodiment of a method disclosed herein of forming fins on a FinFET semiconductor device 100 that is formed on a bulk semiconducting substrate 102. FIG. 2A is a simplified view of an illustrative FinFET semiconductor device 100 at an early stage of manufacturing. As will be recognized by those skilled in the art after a complete reading of the present application, the illustrative FinFET device 100 described herein may be either an N-type FinFET device or a P-type FinFET device. In this illustrative embodiment, the substrate 102 has a bulk semiconducting material configuration. The substrate 102 may be made of silicon or it may be made of materials other than silicon. Thus, the terms "substrate" or "semiconducting substrate" should be understood to cover all forms of all semiconductor materials.

FIG. 2A depicts the device 100 after a trench patterning masking layer 104, e.g., a trench patterning hard mask layer, has been formed above the substrate 102 that corresponds to the desired pattern of fins to be formed in the substrate 102. The trench patterning masking layer 104 is intended to be representative in nature as it may be comprised of a variety of materials, such as, for example, a photoresist material, silicon nitride, silicon oxynitride, etc. Moreover, the trench patterning masking layer 104 may be comprised of multiple layers of material, such as, for example, a silicon nitride layer and a layer of silicon dioxide. The trench patterning masking layer 104 may be formed by depositing the layer(s) of material that comprise the trench patterning masking layer 104 and thereafter directly patterning the masking layer 104 using known photolithography and etching techniques. Alternatively, the trench patterning masking layer 104 may be formed by using known sidewall image transfer techniques. Thus, the particular form and composition of the trench patterning masking layer 104 and the manner in which it is made should not be considered a limitation of the present invention. In the case where the trench patterning masking layer 104 is comprised of one or more hard mask layers, such layers may be formed by performing a variety of known processing techniques, such as a chemical vapor deposition (CVD) process, an atomic layer deposition (ALD) process, an epitaxial deposition process (EPI), or plasma enhanced versions of such processes, and the thickness of such a layer(s) may vary depending upon the particular application.

FIG. 2B depicts the device 100 after a first etching process 106 was performed through the trench patterning masking layer 104 to define a plurality of trenches 106X in the substrate 102. The trenches 106X define a plurality of initial fins 107 having a fin height 107H. Due to the fact that the fins 107 are formed across the substrate, there is little or no undesirable variation in the width (CD) of the initial fins 107 since there is no adverse etch loading effects, as discussed in the background section of this application. The magnitude of the fin height 107H may vary depending upon the particular device under construction, e.g., 100-200 nm. In the depicted example herein, the middle fin 107R of the plurality of initial fins 107 is a to-be-removed fin that will be removed using the process flow disclosed below. Of course, as will be appreciated by those skilled in the art after a complete reading of the present application, any desired number of fins can be removed using the methods disclosed herein.

In the illustrative example depicted in the attached figures, the trenches 106X and the initial fins 107 are all of a uniform size and shape. However, such uniformity in the size and shape of the trenches 106X and the initial fins 107 is not required to practice at least some aspects of the inventions disclosed herein. In the example depicted herein, the trenches 106X are depicted as having been formed by performing a plurality of anisotropic etching processes. In some cases, the trenches 106X may have a reentrant profile near the bottom of the trenches 106X. To the extent the trenches 106X are formed by performing a wet etching process, the trenches 106X may tend to have a more rounded configuration or non-linear configuration as compared to the generally linear configuration of the trenches 106X that are formed by performing an anisotropic etching process. In other cases, the trenches 106X may be formed in such a manner that the initial fins 107 have a tapered cross-sectional configuration (wider at the bottom than at the top at this point in the process flow). Thus, the size and configuration of the trenches 106X, and the manner in which they are made, should not be considered a limitation of the present invention.

FIG. 2C depicts the device 100 after a liner layer 109 was formed adjacent the sidewalls of fins 107 and above the trench patterning hard mask 104. In some embodiments, prior to forming the liner layer 109, a thin layer of silicon dioxide (not shown) may be formed on the sidewalls of the fins 107. The liner layer 109 may be comprised of a variety of different materials, it may be formed to any desired thickness and it may be formed using any of a variety of process operations. In one illustrative embodiment, the liner layer 109 may be comprised of a material that exhibits good etch selectivity relative to the material of the fins 107. For example, in one illustrative embodiment, the liner layer 109 may be comprised of silicon nitride, it may be formed to a thickness of about 3-6 nm, and it may be formed by performing a conformal ALD or CVD process.

FIG. 2D depicts the device 100 after several process operations were performed.

First, a layer of insulating material 110, such as silicon dioxide, was formed so as to overfill the trenches 106X. A chemical mechanical polishing (CMP) process was then performed to planarize the upper surface of the insulating material 110 with the top of the liner layer 109, i.e., to define a common planarized surface.

FIG. 2E depicts the device 100 after a patterned fin removal (fin-cut) hard mask layer 112 was formed above the device 100. The patterned fin removal hard mask layer 112 has an opening 112A that is positioned above the to-be-removed fin—the fin 107R. The patterned fin removal hard mask layer 112 may be formed by depositing a layer of appropriate material, e.g., silicon dioxide, and it may be patterned by forming a patterned layer of photoresist material (not shown) and by performing a traditional etching process. The patterned fin removal hard mask layer 112 may be formed to any desired thickness.

FIG. 2F depicts the device after one or more timed, first liner layer etching processes was performed through the opening 112A in the patterned fin removal hard mask layer 112 to remove underlying portions, but not all, of the liner layer 109 and the underlying portion of the trench patterning hard mask 104 selectively relative to the layer of insulating material 110 and the to-be-removed fin 107R. This process operation exposes an upper surface 107U of the to-be-removed fin 107R, and recesses the liner layer 109 such that the liner layer 109 exposed under the opening 112A has a first recessed upper surface 109R1 that is positioned below the upper surface 107U of the fin 107R by a distance of, for example, 1-5 nm. This recessing exposes a portion, but not all, of the vertical sidewalls of the to-be-removed fin 107R.

FIG. 2G depicts the device 100 after one or more timed, second fin etching processes were performed through the opening 112A in the patterned fin removal hard mask layer 112 to remove portions of the to-be-removed fin 107R selectively relative to the layer of insulating material 110 and the liner layer 109. This process operation consumes some, but not all, of the to-be-removed fin 107R. This second fin etching process removes a portion of the to-be-removed fin 107R such that it has a first recessed upper surface 107R1 that is positioned below the first recessed upper surface 109R1 of the liner layer 109 by a distance of, for example, 10-20 nm.

As will be described more fully below, the cyclical etching sequence described above, i.e., the first liner etch process and second fin etching process, are repeated until the desired amount or all of the to-be-removed fin 107R is removed. The amount of the fin 107R removed during each fin etching process may vary depending upon the particular application.

In one illustrative example, approximately 10-30 nm (height) of the vertical height of the to-be-removed fin 107R may be removed in each of the above-described second etching processes. Thus, in the example where the fins 107 have an initial height 107H of about 100 nm, 3-4 of the fin etching processes described above may be performed to remove the desired amount of the to-be-removed fin 107R. Of course, the number of cycles performed may vary depending upon the particular application FIG. 2H-2I depict the device 100 after another of the dual-etch etching process discussed above has been performed on the device. More specifically, FIG. 2H depicts the device 100 after another liner layer etching process was performed to remove additional portions, but not all, of the liner layer 109 selectively relative to the layer of insulating material 110 and the to-be-removed fin 107R. The etching process performed in FIG. 2H further recesses the liner layer 109 such that the liner layer 109 has a second recessed upper surface 109R2 that is positioned below the first recessed upper surface 107R1 of the to-be-removed fin 107R. FIG. 2I depicts the device 100 after another of the fin etching processes was performed to remove additional portions of the to-be-removed fin 107R selectively relative to the layer of insulating material 110 and the liner layer 109. This process operation removes an additional amount, but not all, of the remaining portion of the fin 107R. This additional fin etching process removes a portion of the to-be-removed fin 107R such that it has a second recessed upper surface 107R2 that is positioned below the second recessed upper surface 109R2 of the liner layer 109.

FIGS. 2J-2K depict the device 100 after another of the dual-etch etching process discussed above has been performed on the device. More specifically, FIG. 2J depicts the device 100 after another liner layer etching process (the third in the depicted example) was performed to remove additional portions of the liner layer 109 selectively relative to the layer of insulating material 110 and the to-be-removed fin 107R. This third liner etching process further recesses the liner layer 109 such that the liner layer 109 has a third recessed upper surface 109R3 that is positioned below the second recessed upper surface 10782 of the fin 107R. FIG. 2K depicts the device 100 after another of the fin etching processes was performed to remove additional portions of the to-be-removed fin 107R selectively relative to the layer of insulating material 110 and the liner layer 109. This process operation removes an additional amount, but not all, of the remaining portion of the to-be-removed fin 107R. This additional fin etching process removes a portion of the fin 107R such that it has a third recessed upper surface 107R3 that is positioned below the third recessed upper surface 109R3 of the liner layer 109.

FIG. 2L depicts the device 100 after the desired number of the liner etch and fin etch process cycles have been performed such the to-be-removed fin 107R has been removed and has a final removed upper surface 107F and the liner layer 109 was recessed to its final recessed upper surface 109F. In the depicted example, the final surface 107F of the removed fin is depicted as being positioned above the bottom of the trench 106X. Of course, if desired the processing sequences disclosed herein may be performed such that the recessed surface 107F is positioned at a level that is below the level of the bottom of the trenches 106X.

FIG. 2M depicts the device 100 after several process operations were performed. First, a layer of insulating material 114, such as silicon dioxide, was formed so as to overfill the opening left by removal of the fin 107R. A chemical mechanical polishing (CMP) process was then performed to planarize the upper surface of the insulating material 114 with the top of the liner layer 109.

FIG. 2N depicts the device 100 after several additional process operations were performed. First, an etch-back process was performed to recess the layers of insulating material 110, 114 to the desired level between the remaining fins 107 and thereby expose a desired amount 107Y of the initial fins 107, which corresponds to the final fin height for the fins of the device 100. Then, another recess etching process was performed to remove the remaining portions of the trench patterning hard mask 104 and portions of the liner layer 109. At the point of fabrication depicted in FIG. 2N, traditional manufacturing operations may be performed to complete the formation of the product 100. For example, a gate structure (not shown) of the device 100 may be formed using either gate-first or gate-last manufacturing techniques, various source/drain and gate contact structures may be formed on the device, various metallization layers may be formed above the product 100 using known processing techniques, etc.

Figure 3A:
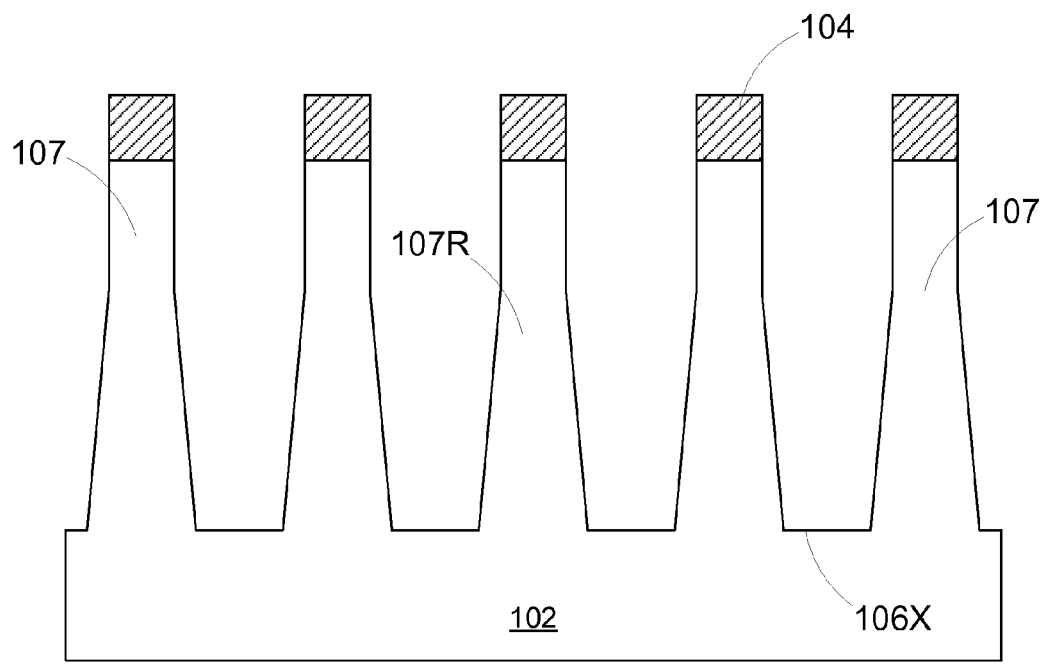
FIGS. 3A-3N depict other illustrative methods disclosed herein for forming fins for FinFET semiconductor devices and selectively removing some of the fins by performing a unique process flow and a cyclical etching process sequence.
Figure 3B:
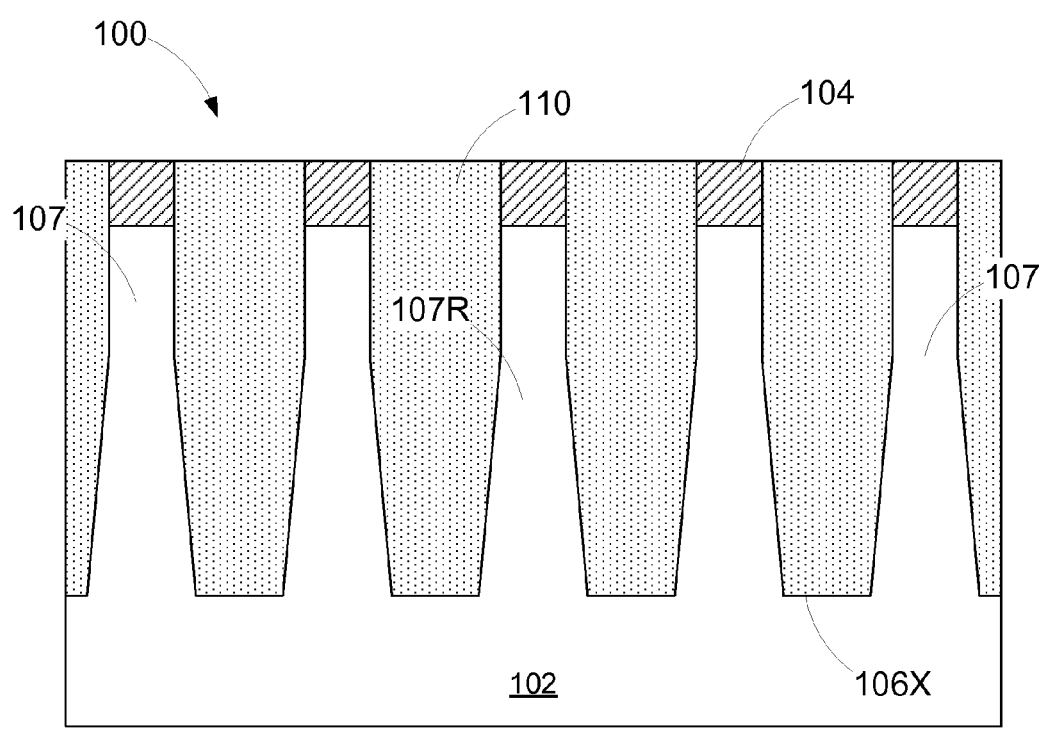
Figure 3C:
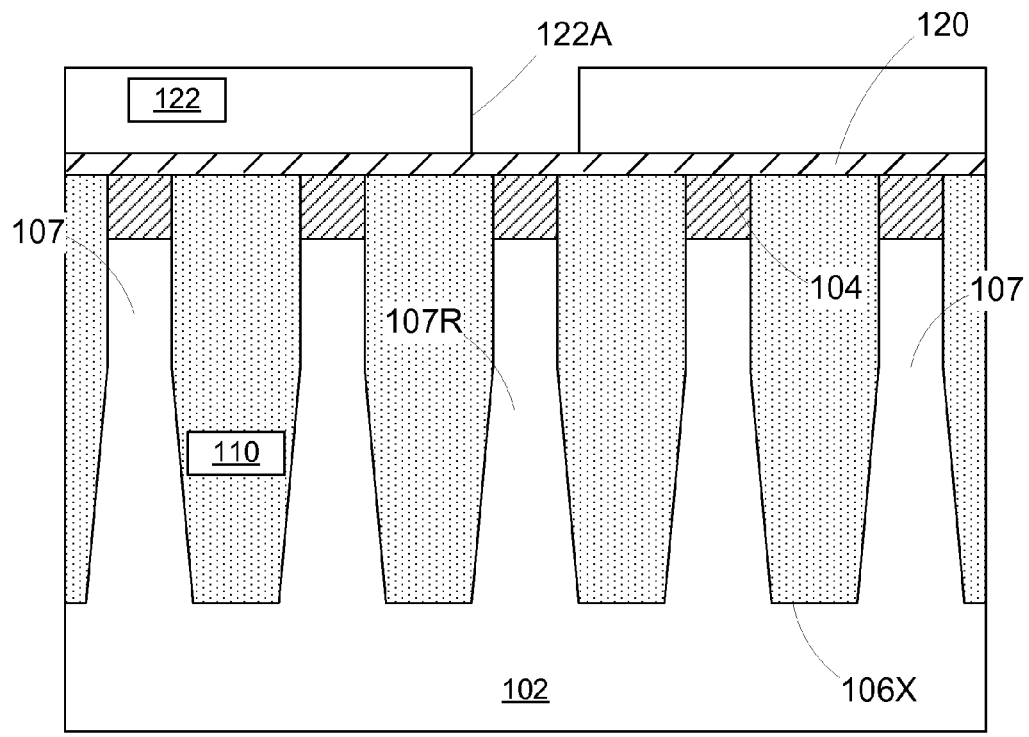
Figure 3D:
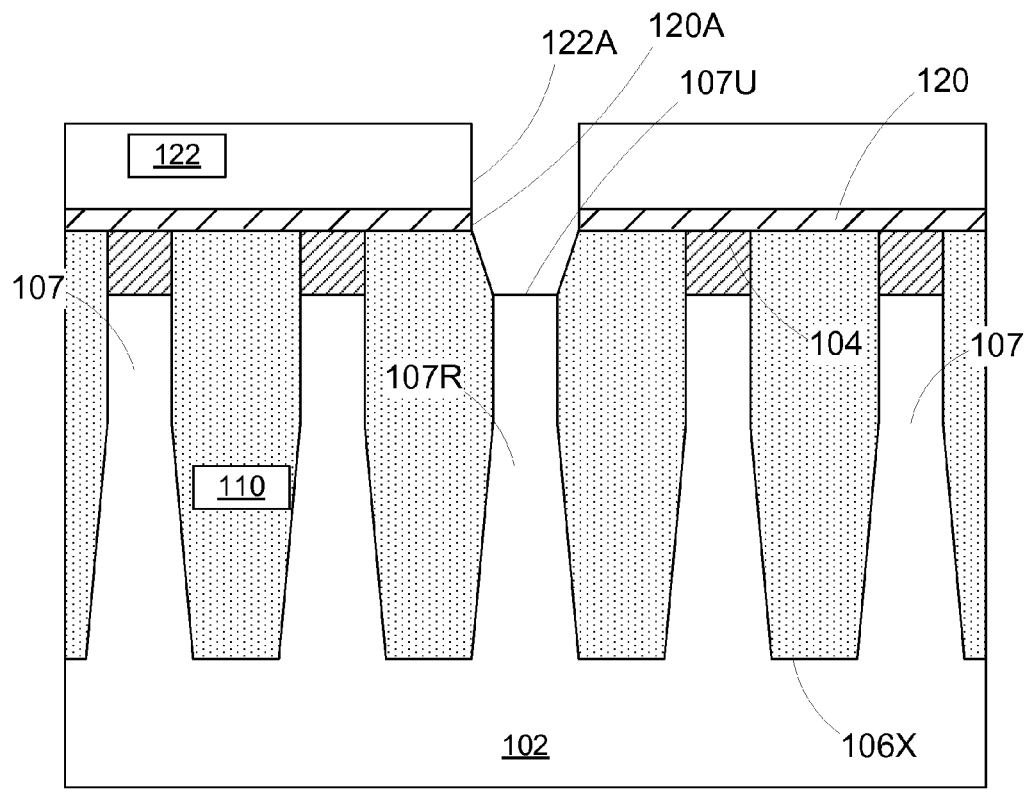
Figure 3E:
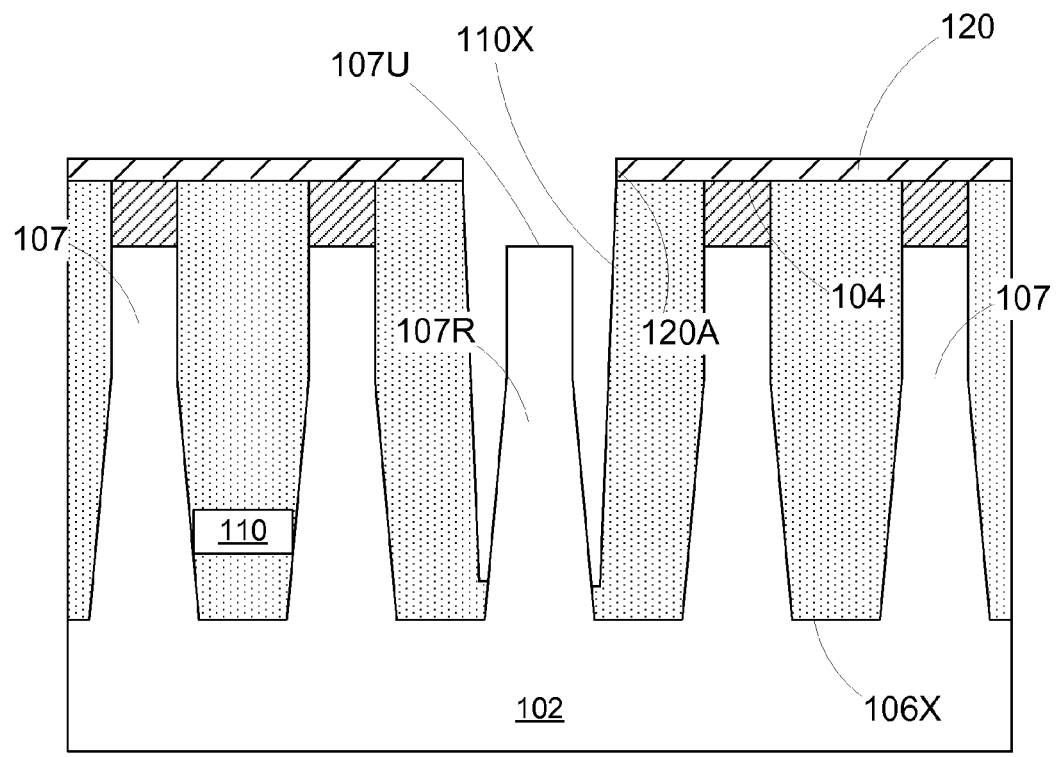
Figure 3F:
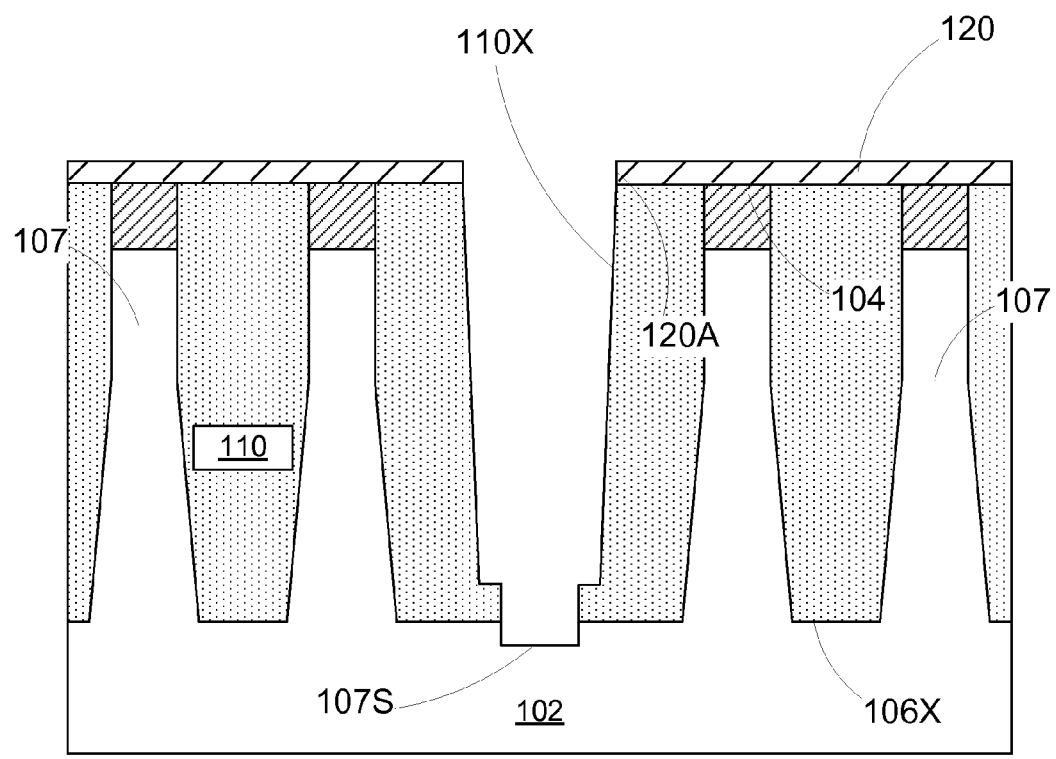
Figure 3G:
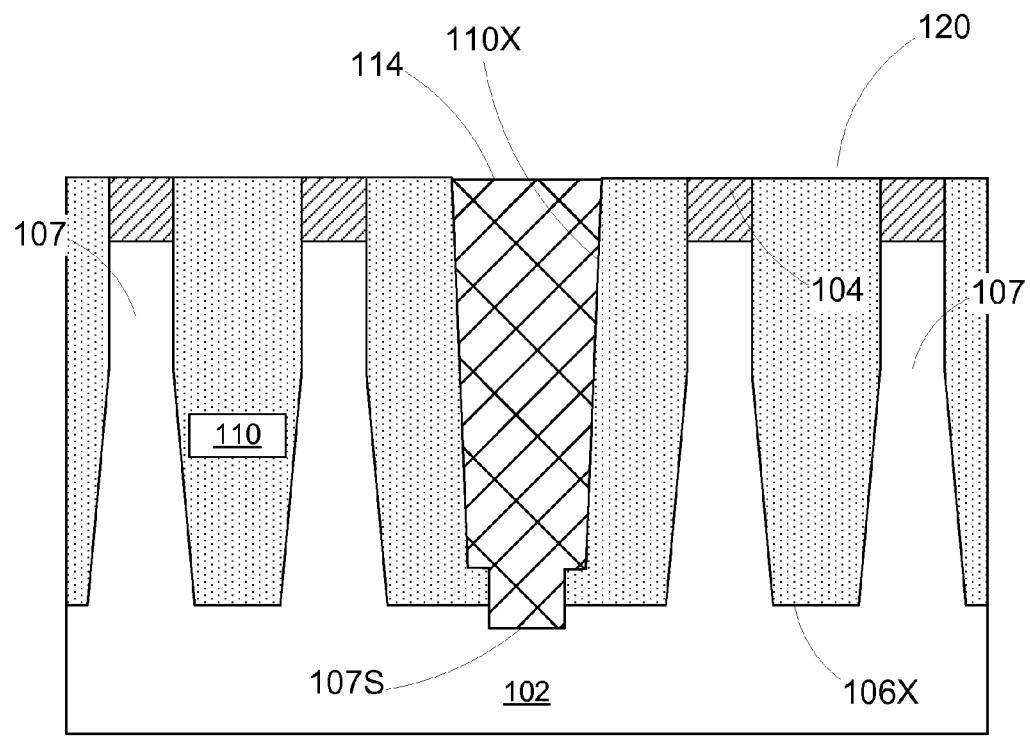
Figure 3H:
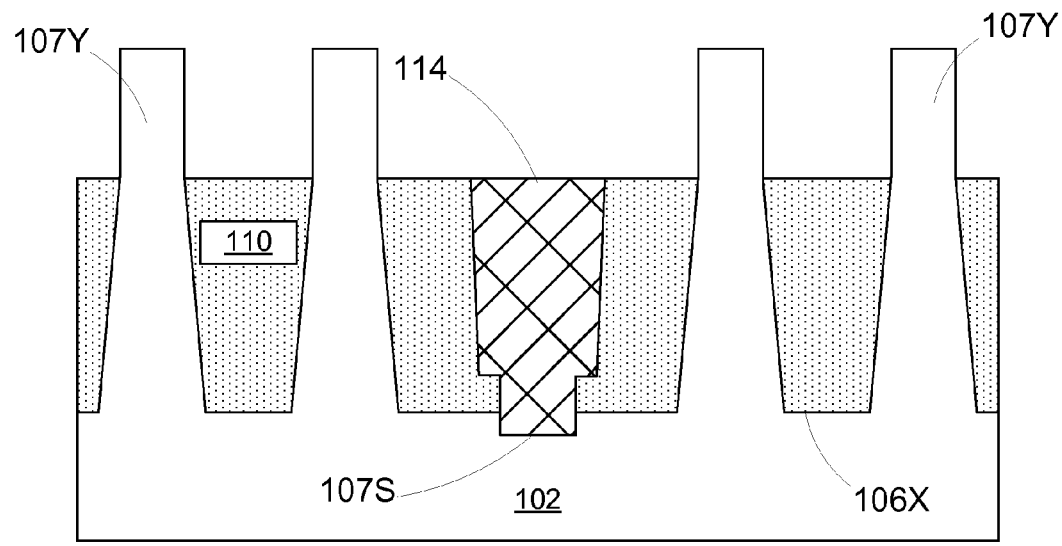
Figure 3I:
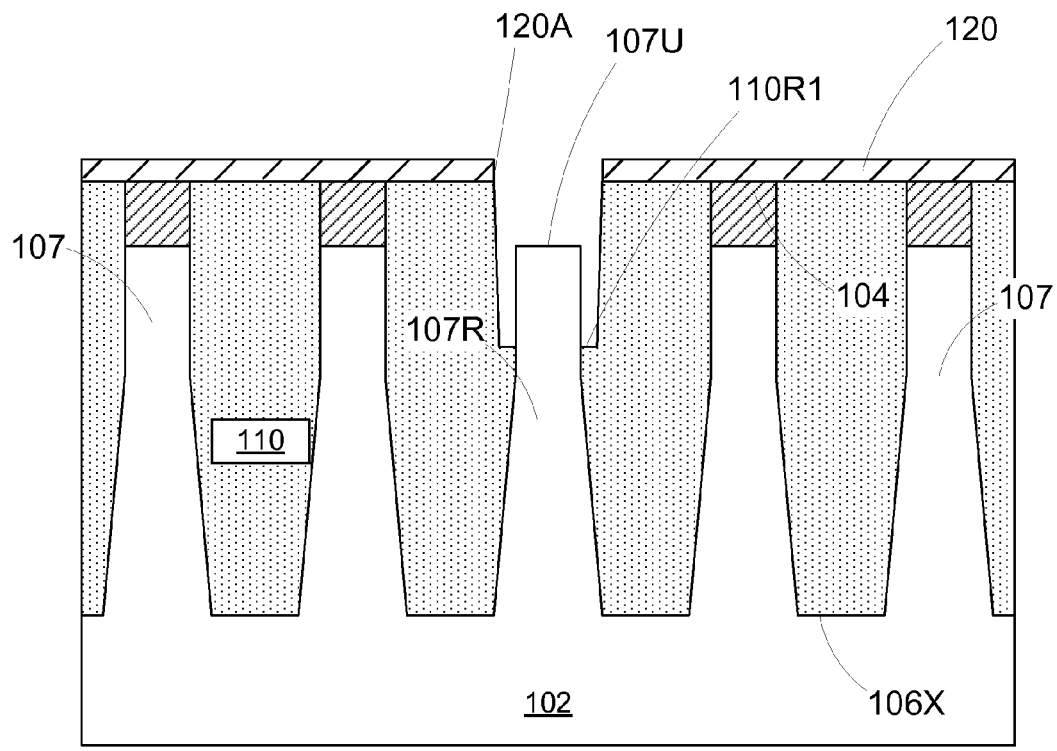
Figure 3J:
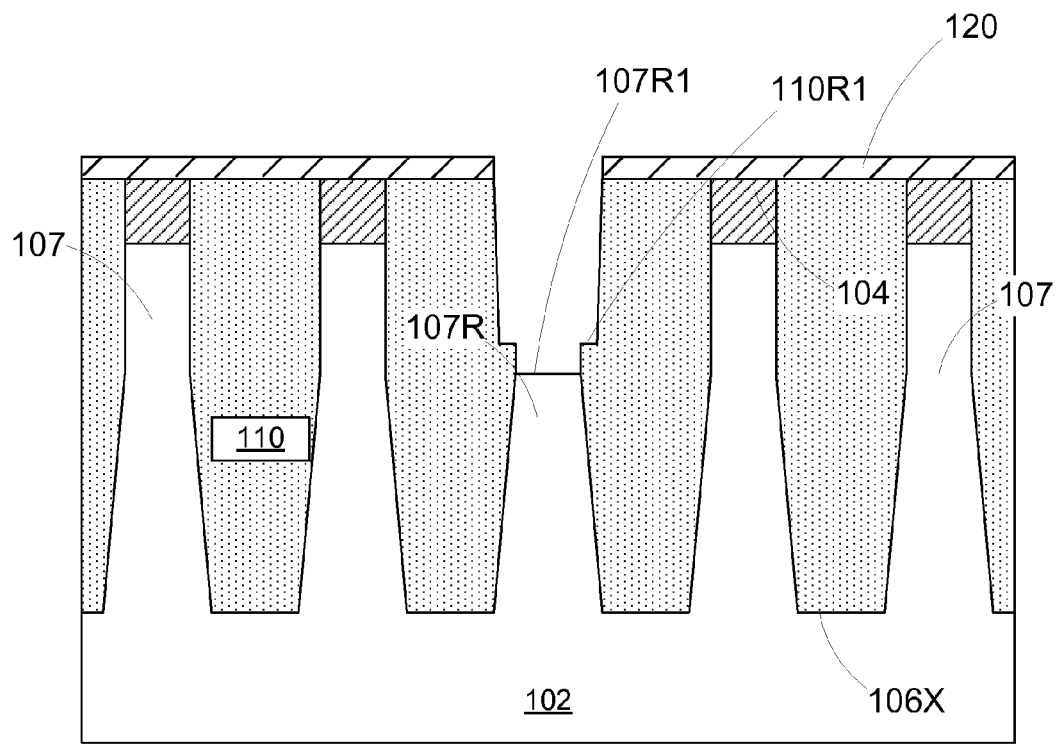
Figure 3K:
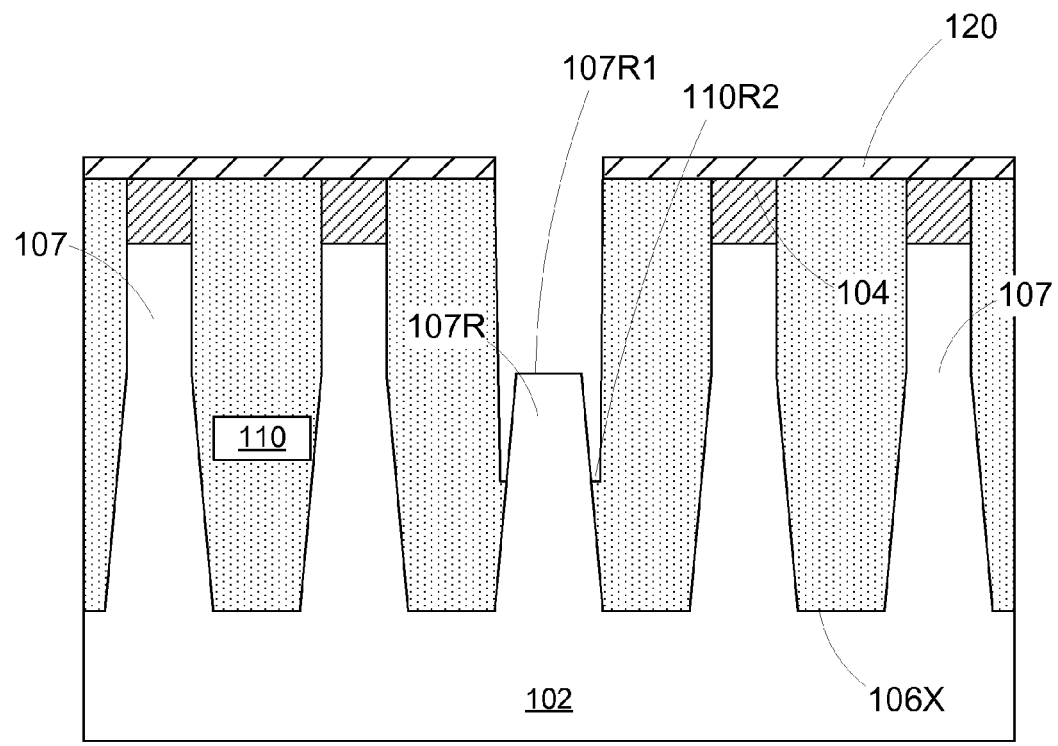
Figure 3L:
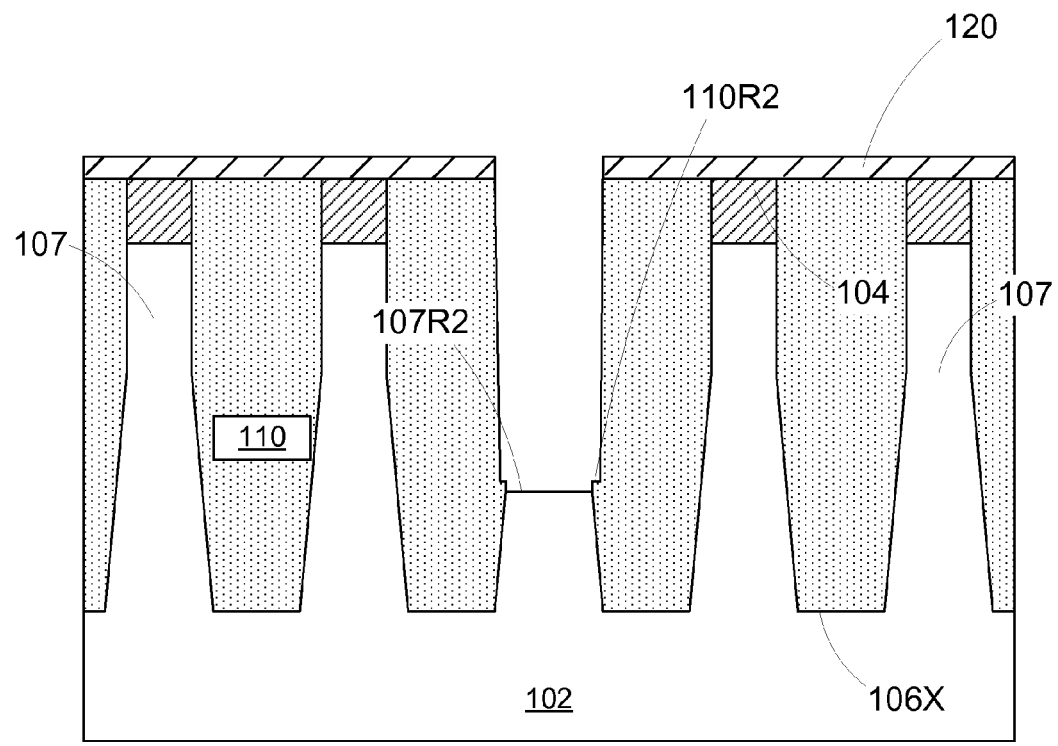
Figure 3M:
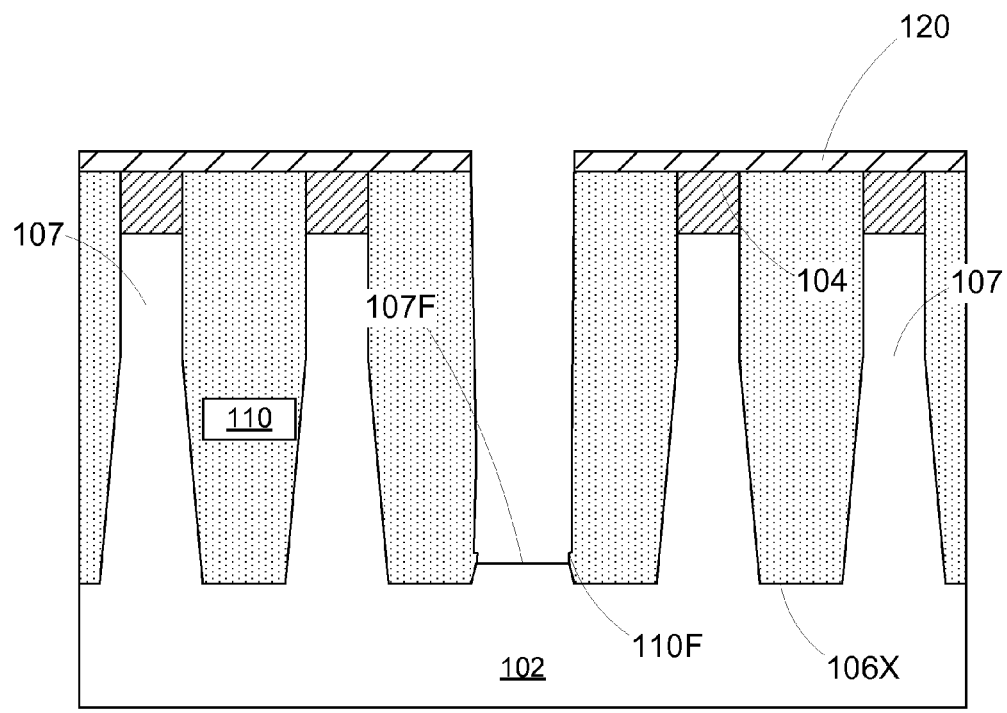
Figure 3N:
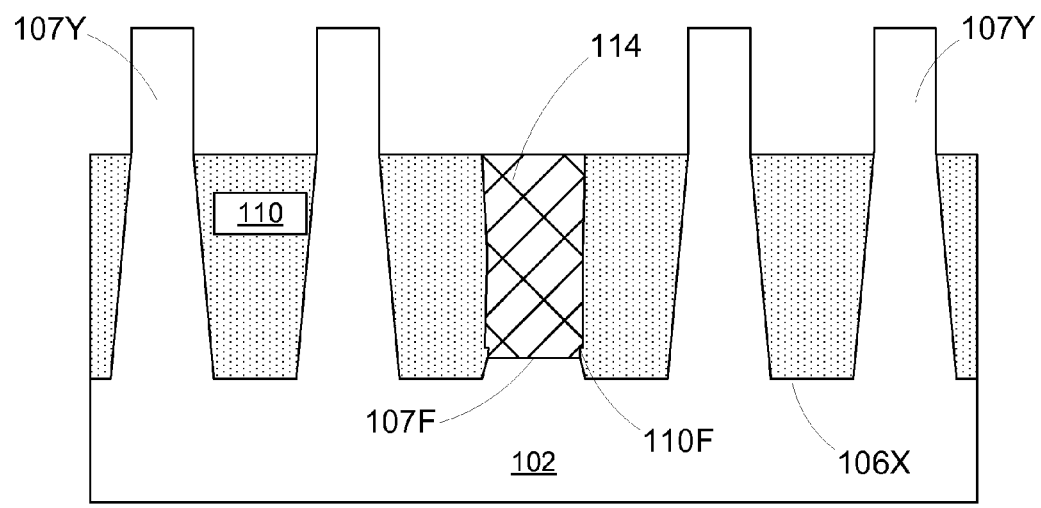

FIGS. 3A-3N depict other illustrative methods disclosed herein for forming fins for FinFET semiconductor devices and selectively removing some of the fins by performing a unique process flow and a cyclical etching process sequence. FIG. 3A depicts the device 100 at the point in processing that corresponds to that depicted in FIG. 2B, i.e., after the trenches 106X were formed in the substrate to define the initial fins 107.

FIG. 3B depicts the device 100 after several process operations were performed. First, the above-described layer of insulating material 110, such as silicon dioxide, was formed so as to overfill the trenches 106X. A chemical mechanical polishing (CMP) process was then performed to planarize the upper surface of the insulating material 110 with the top of the trench patterning hard mask layer 104.

FIG. 3C depicts the device 100 after a fin removal hard mask layer 120, e.g., silicon nitride, was formed above the device 100 and a patterned layer of photoresist material 122 was formed above the device using traditional photolithography tools and techniques. The fin removal hard mask layer 120 may be formed to any desired thickness.

FIG. 3D depicts the device 100 after one or more etching processes were performed through the patterned photoresist layer 122 so as to pattern the fin removal hard mask layer 120 and remove portions of the trench patterning hard mask layer 104 and the layer of insulating material 110 underlying the opening 120A in the patterned fin removal hard mask layer 120. This process operation exposes an upper surface 107U of the to-be-removed fin 107R.

FIG. 3E depicts the device 100 after the patterned layer of photoresist material 122 was removed and after an anisotropic etching process was performed through the opening 120A in the patterned fin removal hard mask layer 120 on the layer of insulating material 110 to define an opening 110X that may expose a substantial portion of the overall height and sidewalls of the to-be-removed fin 107R.

FIG. 3F depicts the device 100 after an anisotropic etching process was performed through the patterned fin removal hard mask layer 120 to remove the desired amount, and in some cases substantially all, of the to-be-removed fin 107R selectively relative to the layer of insulating material 110. In the depicted example, a sufficient amount of the fin 107R is removed such that the surface 107S is positioned at a level that is below the level of the bottom of the trenches 106X.

FIG. 3G depicts the device 100 after several process operations were performed. First, the above-described layer of insulating material 114, such as silicon dioxide, was formed so as to overfill the opening left by removal of the fin 107R. Then, one or more CMP processes were performed to remove the patterned fin removal hard mask layer 120 and to planarize the upper surface of the insulating materials 110, 114 with the top of the trench patterning hard mask 104.

FIG. 3H depicts the device 100 after several additional process operations were performed. First, an etch-back process was performed to recess the layers of insulating material 110, 114 to the desired level between the remaining fins 107 and thereby expose a desired amount 107Y of the fins 107, which corresponds to the final fin height for the fins of the device 100. Then, another etching process was performed to remove the remaining portions of the trench patterning hard mask 104. At the point of fabrication depicted in FIG. 3H, traditional manufacturing operations may be performed to complete the formation of the product 100. For example, a gate structure (not shown) of the device 100 may be formed using either gate-first or gate-last manufacturing techniques, various source/drain and gate contact structures may be formed on the device, various metallization layers may be formed above the product 100 using known processing techniques, etc.

The manner in which the fin 107R may be removed using the cyclical etching process described above will now be described with reference to FIGS. 3I-3N. As with the previously described example of using the cyclical etching sequence described above, in this embodiment, a first etch process will be performed to recess the materials positioned adjacent the fin 107R, which in this example is the insulation material 110, and, thereafter, the above-described second fin etching process, are repeated until the desired amount or all of the to-be-removed fin 107R is removed.

Starting with the structure depicted in FIG. 3D, FIG. 3I depicts the device 100 after several process operations were performed. First, the patterned photoresist mask 122 was removed. Then, one or more timed, first etching processes were performed through the opening 120A in the patterned fin removal hard mask layer 120 to remove underlying portions, but not all, of the layer of insulating material 110 selectively relative to the to-be-removed fin 107R. This process operation exposes the layer of insulating material 110 such that the layer of insulating material 110 exposed under the opening 120A has a first recessed upper surface 110R1 that is positioned below the upper surface 107U of the fin 107R by a distance of, for example, 5-15 nm. This recessing exposes a portion, but not all, of the vertical sidewalls of the to-be-removed fin 107R.

FIG. 3J depicts the device 100 after one or more timed, second fin etching processes were performed through the opening 120A in the patterned fin removal hard mask layer 120 to remove portions of the to-be-removed fin 107R selectively relative to the layer of insulating material 110. This process operation consumes some, but not all, of the to-be-removed fin 107R. This second fin etching process removes a portion of the to-be-removed fin 107R such that it has a first recessed upper surface 107R1 that is positioned below the first recessed upper surface 110R1 of the layer of insulating material 110 by a distance of, for example, 1-10 nm.

As will be described more fully below, the cyclical etching sequence described above, i.e., the first etch process (to remove some of the layer of insulating material 110) and the second fin etching process (to remove portions of the fin 107R), are repeated until the desired amount or all of the to-be-removed fin 107R is removed. As with the case above, the amount of the fin 107R removed during each fin etching process may vary depending upon the particular application.

FIGS. 3K-3L depict the device 100 after another of the dual-etch etching processes discussed above has been performed on the device. More specifically, FIG. 3K depicts the device 100 after another first etching process was performed to remove additional portions, but not all, of the layer of insulating material 110 selectively relative to the to-be-removed fin 107R. The first etching process performed in FIG. 3K further recesses the layer of insulating material 110 such that the layer of insulating material 110 has a second recessed upper surface 110R2 that is positioned below the first recessed upper surface 107R1 of the to-be-removed fin 107R. FIG. 3L depicts the device 100 after another of the fin etching processes was performed to remove additional portions of the to-be-removed fin 107R selectively relative to the layer of insulating material 110. This process operation removes an additional amount, but not all, of the remaining portion of the fin 107R. This additional fin etching process removes a portion of the to-be-removed fin 107R such that it has a second recessed upper surface 107R2 that is positioned below the second recessed upper surface 110R2 of the layer of insulating material 110.

FIG. 3M depicts the device 100 after the desired number of the first and second etching process cycles have been performed such that the to-be-removed fin 107R has been removed and has a final removed upper surface 107F and the layer of insulating material 110 was recessed to its final recessed upper surface 110F. In the depicted example, the final surface 107F of the removed fin is depicted as being positioned above the bottom of the trench 106X. Of course, if desired the processing sequences disclosed herein may be performed such that the recessed surface 107F is positioned at a level that is below the level of the bottom of the trenches 106X.

FIG. 3N depicts the device 100 after the above-described CMP and recess etching processes were performed to expose a desired amount 107Y of the initial fins 107, which corresponds to the final fin height for the fins of the device 100. At the point of fabrication depicted in FIG. 3N, traditional manufacturing operations may be performed to complete the formation of the product 100. For example, a gate structure (not shown) of the device 100 may be formed using either gate-first or gate-last manufacturing techniques, various source/drain and gate contact structures may be formed on the device, various metallization layers may be formed above the product 100 using known processing techniques, etc.

As will be appreciated by those skilled in the art after a complete reading of the present application, the cyclical fin removal process provides several advantages relative to the prior art fin removal techniques discussed in the background section of this application. First, by removing relatively small portions of the vertical height of the fin 107R during each of the second etching processes, the etch shadowing effect (wherein the undesirable residual fin material 15X is formed (see FIG. 1L), may be reduced or eliminated when performing the anisotropic fin etching processes. Additionally, using the methods disclosed herein, the fin 107R may be removed by performing anisotropic etching processes, thereby avoiding the problems associated with performing an isotropic etching process to insure complete removal of the fin 207R, namely the undercutting of the desired fins in the direction indicated by the arrows 21 shown in FIG. 1J.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed is:

1. A method, comprising:
    forming a trench patterning hard mask layer above a surface of a semiconductor substrate;
    performing at least one first etching process through said trench patterning hard mask layer to define a plurality of trenches in said semiconductor substrate to thereby define a plurality of initial fins in said substrate, wherein at least one of said initial fins is a to-be-removed fin;
    forming a layer of insulating material within said trenches;
    forming a patterned fin removal masking layer above said plurality of initial fins and said layer of insulating material, said patterned fin removal masking layer having an opening positioned above said at least one to-be-removed fin, wherein a portion of said trench patterning hard mask layer is positioned above said at least one to-be-removed fin and below said opening in said patterned fin removal masking layer;
    performing at least one second etching process through said opening in said patterned fin removal masking layer to remove at least the underlying portion of said trench patterning hard mask layer;
    after performing said at least one second etching process, performing a third etching process through said opening in said patterned fin removal masking layer to define a fin opening in said layer of insulating material that exposes substantially all of a vertical height of said at least one to-be-removed fin;
    performing a fourth etching process through said opening in said patterned fin removal masking layer and said fin opening in said layer of insulating material until the desired amount of said at least one to-be-removed fin is removed; and
    forming an insulating material in an area that includes an area formerly occupied by said at least one to-be-removed fin.

2. The method of claim 1, further comprising performing at least one additional recess etching process to recess said layer of insulating material such that a desired final fin height of the remaining plurality of initial fins are exposed above said recessed layer of insulating material.

3. The method of claim 1, wherein forming said patterned fin removal masking layer comprises depositing a layer of fin removal masking material above a common planarized surface of said layer of insulating material and said trench patterning hard mask layer and patterning the deposited fin removal masking layer by performing an etching process through a patterned photoresist mask layer formed above the deposited layer of fin removal masking material.

4. The method of claim 1, wherein said trench patterning hard mask layer and said patterned fin removal masking layer are both comprised of silicon nitride.

5. The method of claim 1, wherein said fourth etching process consumes substantially all of a vertical height of said at least one to-be-removed fin.

6. The method of claim 1, wherein said third and fourth etching processes are anisotropic etching processes.

7. A method, comprising:
forming a plurality of trenches in a semiconductor substrate to thereby define a plurality of initial fins in said substrate, said initial fins having sidewalls, wherein at least one of said initial fins is a to-be-removed fin;
performing a blanket deposition process to form a layer of insulating material adjacent said sidewalls of said initial fins and within said trenches and above a bottom of said trenches;
forming a fin removal masking layer above said plurality of initial fins, said fin removal masking layer having an opening positioned above said at least one to-be-removed fin and at least a portion of said layer of insulating material that was formed adjacent said at least one to-be-removed fin;
removing a desired portion of said at least one to-be-removed fin by:
(a) performing a recess etching process on said layer of insulating material that was formed adjacent said at least one to-be-removed fin to remove a portion, but not all, of said layer of insulating material that was formed adjacent said at least one to-be-removed fin;
(b) after performing said recess etching process, performing a fin recess etching process to remove a portion, but not all, of said at least one to-be-removed fin; and
(c) repeating steps (a) and (b) until the desired amount of said at least one to-be-removed fin is removed; and
forming an insulating material in an area that includes an area formerly occupied by said at least one to-be-removed fin.

8. The method of claim 7, wherein each of said etching processes set forth in step (b) consumes between 10-30 nm of a vertical height of said at least one to-be-removed fin.

9. The method of claim 7, wherein, after performing step (a), an upper surface of said recessed layer of insulating material that was formed adjacent said at least one to-be-removed fin is positioned at a level that is below a level of an upper surface of said at least one to-be-removed fin.

10. The method of claim 7, wherein steps (a) and (b) are repeated at least three times.

11. A method, comprising:
forming a plurality of trenches in a semiconductor substrate to thereby define a plurality of initial fins in said substrate, said initial fins having sidewalls, wherein at least one of said initial fins is a to-be-removed fin;
performing a blanket deposition process to form a layer of insulating material adjacent said sidewalls of said initial fins and within said trenches and above a bottom of said trenches;
forming a fin removal masking layer above said plurality of initial fins, said fin removal masking layer having an opening positioned above said at least one to-be-removed fin and at least a portion of said layer of insulating material that was formed adjacent said at least one to-be-removed fin;
removing a desired portion of said at least one to-be-removed fin by:
(a) performing a recess etching process on said layer of insulating material that was formed adjacent said at least one to-be-removed fin to remove a portion, but not all, of said layer of insulating material that was formed adjacent said at least one to-be-removed fin, wherein, after performing step (a), an upper surface of said recessed layer of insulating material that was formed adjacent said at least one to-be-removed fin is positioned at a level that is below a level of an upper surface of said at least one to-be-removed fin;
(b) after performing said recess etching process, performing a fin recess etching process to remove a portion, but not all, of said at least one to-be-removed fin; and
(c) repeating steps (a) and (b) until the desired amount of said at least one to-be-removed fin is removed, wherein each of said etching processes set forth in step (b) consumes between 10-30 nm of a vertical height of said at least one to-be-removed fin; and
forming an insulating material in an area that includes an area formerly occupied by said at least one to-be-removed fin.

12. The method of claim 11, wherein steps (a) and (b) are repeated at least three times.

* * * * *